(12) United States Patent
Tsuchi

(10) Patent No.: US 12,205,512 B2
(45) Date of Patent: Jan. 21, 2025

(54) OUTPUT BUFFER CIRCUIT, DISPLAY DRIVER, DATA DRIVER, AND DISPLAY DEVICE

(71) Applicant: LAPIS Technology Co., Ltd., Yokohama (JP)

(72) Inventor: Hiroshi Tsuchi, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 0 days.

(21) Appl. No.: 18/491,805

(22) Filed: Oct. 23, 2023

(65) Prior Publication Data
US 2024/0144853 A1 May 2, 2024

(30) Foreign Application Priority Data

Oct. 31, 2022 (JP) ................................ 2022-174601
Sep. 29, 2023 (JP) ................................ 2023-169999

(51) Int. Cl.
*G09G 3/20* (2006.01)
*H03K 19/0185* (2006.01)

(52) U.S. Cl.
CPC ... *G09G 3/2092* (2013.01); *H03K 19/018521* (2013.01); *G09G 2310/0267* (2013.01); *G09G 2310/0275* (2013.01); *G09G 2310/0289* (2013.01); *G09G 2310/0291* (2013.01); *G09G 2330/021* (2013.01); *G09G 2330/06* (2013.01)

(58) Field of Classification Search
CPC ... H03K 19/018521; G09G 2310/0291; G09G 2310/0267; G09G 2310/0275; G09G 2310/0289; G09G 3/3225; G09G 3/2092; G09G 3/3275; G09G 3/3685; G09G 2330/021; G09G 2330/06
See application file for complete search history.

(56) References Cited

U.S. PATENT DOCUMENTS

| | | | | |
|---|---|---|---|---|
| 5,546,016 A | * | 8/1996 | Allen | ................. H04L 25/0278 |
| | | | | 326/30 |
| 5,596,297 A | * | 1/1997 | McClure | ................ G05F 3/262 |
| | | | | 327/543 |
| 2017/0004799 A1 | * | 1/2017 | Park | ..................... G09G 3/3688 |
| 2017/0154568 A1 | * | 6/2017 | Tsuchi | .......... H03K 19/018521 |
| 2019/0147825 A1 | * | 5/2019 | Tsuchi | ................. H03F 3/4521 |
| | | | | 345/209 |

FOREIGN PATENT DOCUMENTS

JP H06152374 5/1994

\* cited by examiner

*Primary Examiner* — Dong Hui Liang
(74) *Attorney, Agent, or Firm* — JCIPRNET

(57) ABSTRACT

An output buffer circuit includes a first transistor supplying a first high-voltage power supply voltage in a case of being ON in response to a voltage of an input signal received through a gate; a second transistor supplying a second high-voltage power supply voltage in the case of being ON in response to a voltage of the input signal received through a gate; an output control part that shifts a transistor, of the first and second transistors, being ON to OFF at a time of voltage change of the input signal by changing the voltage in the gate thereof, and turns a transistor being OFF to ON by changing the voltage in the gate thereof at a rate of change based on a current value controlled by a bias voltage, and a bias modulation part that sets a voltage value of the bias voltage to a designated voltage value.

17 Claims, 20 Drawing Sheets

|  |  | Setting 1 | Setting 2 | Setting 3 | Setting 4 |
|---|---|---|---|---|---|
| Pc1 (PctI1) | First bit | 0 | 1 | 0 | 1 |
|  | Second bit | 0 | 0 | 1 | 1 |
| Switch state | Switch 84 | OFF | ON | OFF | ON |
|  | Switch 85 | OFF | OFF | ON | ON |
| 19Ay1 current ratio |  | 1 | 2 | 3 | 4 |

FIG. 15A

|  |  | Setting 1 | Setting 2 | Setting 3 | Setting 4 |
|---|---|---|---|---|---|
| Pc2 (PctI2) | First bit | 0 | 1 | 0 | 1 |
|  | Second bit | 0 | 0 | 1 | 1 |
| Switch state | Switch 95 | OFF | ON | OFF | ON |
|  | Switch 96 | OFF | OFF | ON | ON |
| 19Ay2 current ratio |  | 1 | 2 | 3 | 4 |

FIG. 15B

OUTPUT BUFFER CIRCUIT, DISPLAY DRIVER, DATA DRIVER, AND DISPLAY DEVICE

CROSS-REFERENCE TO RELATED APPLICATION

This application claims the priority benefit of Japan application serial no. 2022-174601, filed on Oct. 31, 2022 and Japan application serial no. 2023-169999, filed on Sep. 29, 2023. The entirety of the above-mentioned patent applications is hereby incorporated by reference herein and made a part of this specification.

BACKGROUND

Technical Field

The disclosure relates to an output buffer circuit driving a load, and a display driver, a data driver and a display device including this output buffer circuit.

Description of Related Art

A semiconductor integrated device driving an externally connected load is provided with an output buffer that outputs a drive signal for driving the load. The output buffer includes, for example, a P-channel metal oxide semiconductor (MOS) type transistor and an N-channel MOS transistor which receive binary (logic level 0, 1) input signals in respective gate ends and in which respective drain ends are connected to an output node. Due to the constitution, the output buffer outputs binary drive signals from the output node by setting both the transistors described above to an ON state in accordance with the binary input signals in a complementary manner.

Incidentally, when a load to be driven is a large-capacitance load such as a liquid crystal display panel or an organic EL display panel having a relatively large capacitance and requiring high-voltage pulse driving, a high-speed drive output buffer is used as an output buffer.

In such a high-speed drive output buffer, due to a delay in a timing at which the other transistor switches from the ON state to the OFF state compared to the timing at which one transistor of both the transistors switches from the OFF state to the ON state, there are cases in which both transistors are temporarily in an ON state at the same time. Accordingly, a relatively large through-current flows between both the transistors, and there is a problem of occurrence of electromagnetic interference (EMI) and increase in power consumption caused by the through-current. In addition, there is also a problem of occurrence of EMI caused due to fluctuation in current involved in charging and discharging currents when a load is driven.

Hence, in order to resolve the problems, an output buffer circuit provided with a pre-buffer part in a previous stage to a buffer part constituted of the P-channel MOS transistor and the N-channel MOS transistor described above has been proposed (refer to Patent Document 1: Japanese Patent Application Laid-Open No. H6-152374).

The pre-buffer part included in the output buffer circuit described in Patent Document 1 has a first inverter that receives an input signal and supplies an inverted signal thereof to a gate of the P-channel MOS transistor described above, and a second inverter that receives an input signal and supplies an inverted signal thereof to a gate of the N-channel MOS transistor described above. At this time, a current source is connected to a source of the N-channel MOS transistor of the first inverter, and another current source is connected to a source of the P-channel MOS transistor of the second inverter. In the output buffer circuit described in Patent Document 1, a shift of both the transistors of the buffer part from the ON state to the OFF state is made earlier than a shift thereof from the OFF state to the ON state by individually adjusting the current flowing in each of the current sources of the pre-buffer part. Accordingly, in the output buffer circuit, a state in which both the transistors of the buffer part are in the ON state at the same time is avoided, a through-current is prevented, and voltage change of an output signal occurs slowly.

Incidentally, in the output buffer circuit described in Patent Document 1, as the current flowing in the current source of the pre-buffer part is reduced, the time for a shift of both the transistors of the buffer part from the OFF state to the ON state becomes longer.

Accordingly, voltage change of an output signal becomes gradual so that occurrence of a through-current is reliably curbed and reduction of EMI can be achieved. However, due to deterioration in current driving capability of the output buffer circuit and increase in dullness of the pulse voltage waveform of an output signal, a load cannot be driven fast.

In this manner, there is a trade-off relationship between reduction of EMI and a current driving capability, and an optimal adjustment value thereof varies depending on the load to be driven. Hence, it is desired to adopt an output buffer circuit that has a built-in adjustment circuit for adjusting the current driving capability.

In the case of a high-speed drive output buffer circuit, there is also a need to build a current driving capability adjustment circuit itself using transistors having a relatively large size for a high voltage. Thus, particularly, when a multi-output constitution including a plurality of output buffer circuits described above is adopted in order to drive a plurality of loads, the circuit area increases in proportion to the number of output buffer circuits.

SUMMARY

An output buffer circuit according to an embodiment of the disclosure is an output buffer circuit outputting, from an output terminal, an output signal obtained by amplifying an input signal. The output buffer circuit includes a first transistor of a first conductivity type that supplies a first high-voltage power supply voltage to the output terminal in a case of being in an ON state in response to a voltage of the input signal received through a gate of itself; a second transistor of a second conductivity type that supplies a second high-voltage power supply voltage lower than the first high-voltage power supply voltage to the output terminal in the case of being in the ON state in response to a voltage of the input signal received through a gate of itself; a bias part that generates a bias voltage; an output control part that shifts a transistor, of the first transistor and the second transistor, in the ON state to an OFF state at a time of voltage change of the input signal by changing the voltage in the gate of the transistor in the ON state at a rate of change corresponding to the voltage change of the input signal, and turns a transistor, of the first transistor and the second transistor, in the OFF state to the ON state by changing the voltage in the gate of the transistor in the OFF state at a rate of change based on a current value controlled by the bias voltage; and a drive setting part that designates a voltage value of the bias voltage and generates a setting signal for setting the bias voltage to the voltage value. The bias part includes a bias modulation part which operates upon reception of a first low-voltage power supply voltage having a voltage value equal to or smaller than the first high-voltage power supply voltage and a second low-voltage power supply voltage having a voltage value equal to or larger than the second high-voltage power supply voltage, and sets the voltage value of the bias voltage to a voltage value based on the setting signal.

In addition, an output buffer circuit according to an embodiment of the disclosure is an output buffer circuit outputting first to Mth output signals obtained by amplifying first to Mth (M is an integer of 2 or larger) input signals. The output buffer circuit includes a bias part that generates a bias voltage; a drive setting part that designates a voltage value of the bias voltage and generates a setting signal for setting the bias voltage to the voltage value; and first to Mth buffer parts that individually receive the first to Mth input signals and output the first to Mth output signals via respective output terminals. Each of the first to Mth buffer parts includes a first transistor of a first conductivity type which supplies a first high-voltage power supply voltage to the output terminal of itself in a case of being in an ON state in response to a voltage of the input signal received through a gate of itself; a second transistor of a second conductivity type which supplies a second high-voltage power supply voltage lower than the first high-voltage power supply voltage to the output terminal of itself in the case of being in the ON state in response to a voltage of the input signal received through a gate of itself; and an output control part which shifts a transistor, of the first transistor and the second transistor, in the ON state to an OFF state at a time of voltage change of the input signal by changing the voltage in the gate of the transistor in the ON state at a rate of change corresponding to the voltage change of the input signal, and turns a transistor, of the first transistor and the second transistor, in the OFF state to the ON state by changing the voltage in the gate of the transistor in the OFF state at a rate of change based on a current value controlled by the bias voltage. The bias part is provided in a manner of being shared by each of the first to Mth buffer parts. The bias part includes a bias modulation part which operates upon reception of a first low-voltage power supply voltage having a voltage value smaller than the first high-voltage power supply voltage or equal to or smaller than the first high-voltage power supply voltage and a second low-voltage power supply voltage having a voltage value larger than the second high-voltage power supply voltage or equal to or larger than the second high-voltage power supply voltage, and sets the voltage value of the bias voltage to a voltage value based on the setting signal, and the bias part supplies the bias voltage having a voltage value set by the bias modulation part to each of the first to Mth buffer parts.

A data driver according to an embodiment of the disclosure is a data driver driving a display panel according to a video signal. The display panel has a plurality of scanning lines disposed in a horizontal direction of a screen, a plurality of data lines, to which a plurality of drive signals based on the video signal are supplied from the data driver, disposed in a manner intersecting the plurality of scanning lines and a scanning driver that drives the plurality of scanning lines at a timing corresponding to a plurality of scanning timing signals. The data driver includes a scanning control signal output circuit which outputs the plurality of scanning timing signals supplied to the scanning driver. The scanning control signal output circuit is constituted of the output buffer circuit having the multi-output constitution described above.

A display driver according to an embodiment of the disclosure is a display driver driving, in response to a video signal, a passive matrix-type display panel including a plurality of scanning lines disposed in a horizontal direction of a screen and a plurality of data lines disposed in a manner intersecting the plurality of scanning lines. The display driver includes a data driver that includes a first output buffer part which outputs a plurality of drive pulse signals having a pulse width corresponding to a luminance level of each pixel indicated by the video signal to the plurality of data lines, and a scanning driver that includes a second output buffer part which outputs a plurality of scanning pulse signals to the plurality of scanning lines. The first output buffer part and the second output buffer part are respectively constituted of the output buffer circuit having the multi-output constitution described above.

A display device according to an embodiment of the disclosure is a display device having a display panel and a data driver. The display panel includes a plurality of scanning lines disposed in a horizontal direction of a screen, a plurality of data lines, to which a plurality of drive signals based on a video signal are supplied from the data driver, disposed in a manner intersecting the plurality of scanning lines and a scanning driver which drives the plurality of scanning lines at a timing corresponding to a plurality of scanning timing signals. The data driver has a scanning control signal output circuit outputting the plurality of scanning timing signals to the scanning driver. The scanning control signal output circuit is constituted of the output buffer circuit having the multi-output constitution described above.

BRIEF DESCRIPTION OF THE DRAWINGS

FIG. 15A and FIG. 15B are diagrams for illustrating a setting operation of the current driving capability of the buffer part 10Ay.

DESCRIPTION OF THE EMBODIMENT

Figure 1:
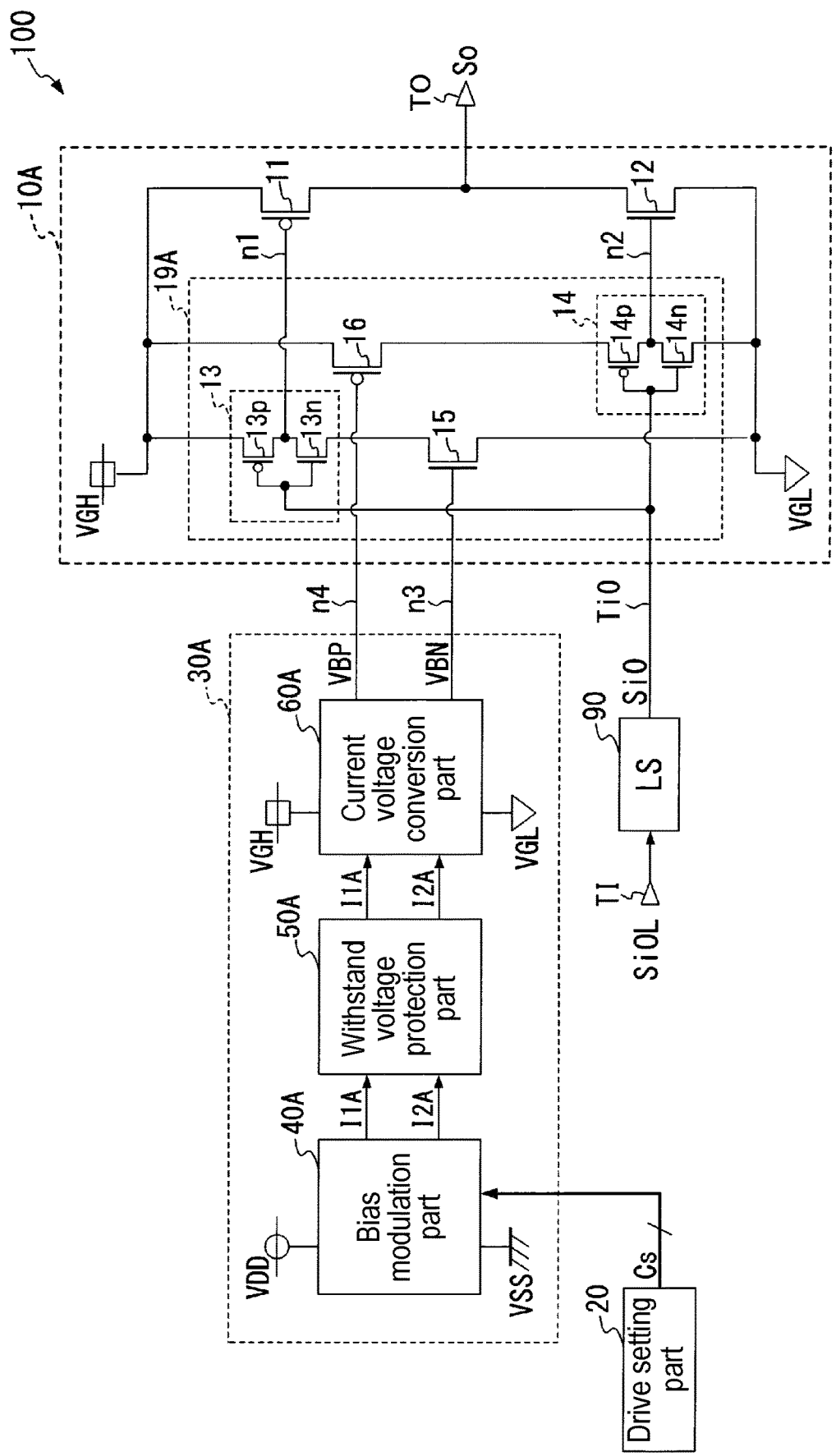
FIG. 1 is a circuit diagram showing a constitution of an output buffer circuit 100 as an example of an output buffer circuit according to the disclosure.

Embodiments of the disclosure of this application provide an output buffer circuit having a function of adjusting a current driving capability and capable of achieving space-saving when a multi-output constitution is adopted, and a display driver and a display device including this output buffer circuit.

In the output buffer circuit according to the embodiments of the disclosure, the output control part controls the gate voltage of each of the first and second transistors in an output stage based on the input signal, and thus the first and second transistors are respectively set to the ON state and the OFF state in a complementary manner. At this time, the output control part controls the first and second transistors as follows at the time of voltage change of the input signal. That is, a transistor, of the first and second transistors, in the ON state is quickly shifted to the OFF state by changing the gate voltage of this transistor at a rate of change corresponding to the voltage change of the input signal. Moreover, a transistor, of the first and second transistors, in the OFF state is turned to the ON state by adjusting a current driving capability by changing the gate voltage of this transistor at a rate of change based on a current value controlled by the bias voltage set in accordance with the setting signal. The bias part that generates the bias voltage to be supplied to the output buffer part includes the bias modulation part which operates at a low power supply voltage equal to or lower than the power supply voltage used in the output control part and the output stage, and variably sets the voltage value of the bias voltage in the bias modulation part.

Accordingly, in the output buffer circuit of the embodiments of the disclosure, at the time of voltage change of the input signal, a situation in which the first and second transistors in the output stage are turned on at the same time can be avoided. As a result, an instantaneous through-current flowing between the first and second transistors is prevented, and occurrence of EMI involved in the through-current is inhibited. In addition, since the bias modulation part that generates a bias voltage for setting the current driving capability of the output buffer circuit of the disclosure can be constituted of a low-voltage circuit, an adjustment range of the bias voltage can be increased with a space-saving constitution having small increase in area. Accordingly, EMI occurring due to fluctuation in charging and discharging currents when a load is driven can be reduced, and optimal adjustment with minimized distortion of a voltage waveform of an output signal can be performed.

In addition, when the output buffer circuit has a multi-output constitution by providing a plurality of buffer parts constituted of the output stage and the output control part described above, the bias part generating a bias voltage for dealing with adjustment of the current driving capability described above can be constituted in one system shared by a plurality of buffer parts. Therefore, even when an output buffer circuit having many buffer parts is provided, space-saving of the device in its entirety can be achieved.

Thus, according to the embodiments of the disclosure, it is possible to provide an output buffer circuit having a function of adjusting a current driving capability for optimizing distortion reduction of a voltage waveform of an output signal and optimizing EMI reduction, and capable of achieving space-saving when a multi-output constitution is adopted.

Example 1

FIG. 1 is a circuit diagram showing a constitution of an output buffer circuit 100 as an example of an output buffer circuit according to the disclosure.

As shown in FIG. 1, the output buffer circuit 100 includes a buffer part 10A, a drive setting part 20, a bias part 30A, and a level shifter 90.

The level shifter 90 receives a binary (logic level 0 or 1) input signal Si0L having a voltage changing with a low-voltage amplitude (power supply voltages VSS to VDD) via an input terminal TI. The level shifter 90 converts the input signal Si0L into a high-voltage input signal Si0 of which the amplitude is level-shifted to a high-voltage range (power supply voltages VGL to VGH). The power supply voltages VSS, VDD, VGL and VGH have the following magnitude relationship.

$$VGH > VDD > VSS \geq VGL \text{ or}$$

$$VGH \geq VDD > VSS > VGL$$

Further, the level shifter 90 supplies the high-voltage input signal Si0 to the buffer part 10A via a node Ti0.

The buffer part 10A is constituted of high-voltage elements and is constituted of the following high-voltage elements which operate in a high-voltage power supply voltage range (VGL to VGH).

That is, the buffer part 10A includes an output stage constituted of a P-channel transistor 11 and an N-channel transistor 12, and an output control part 19A controlling a gate voltage of each of these transistors 11 and 12.

The power supply voltage VGH is applied to a source of the transistor 11, and the power supply voltage VGL is applied to the source of the transistor 12. Drains of the transistors 11 and 12 are connected to an output terminal TO, and a binary (logic level 0 or 1) signal having a voltage generated in the output terminal TO is output as an output signal So.

The output control part 19A includes inverters 13 and 14, an N-channel transistor 15 and a P-channel transistor 16.

The inverter 13 is constituted of an N-channel transistor 13$n$ and a P-channel transistor 13$p$. Respective gates thereof are commonly connected to each other, form an input end of the inverter 13, and are connected to the node Ti0. The respective drains thereof are commonly connected to each other, form an output end of the inverter 13, and are connected to a node n1. The source of the transistor 13p is connected to a positive-side power supply terminal and receives the power supply voltage VGH, and the source of the transistor 13n is connected to a negative-side power supply terminal via the transistor 15 and receives the power supply voltage VGL. Namely, the inverter 13 supplies the voltage of a signal, which is obtained by inverting the phase of the high-voltage input signal Si0 received via the node Ti0, to the gate of the transistor 11 via the node n1.

The inverter 14 is constituted of an N-channel transistor 14n and a P-channel transistor 14p. The respective gates thereof are commonly connected to each other, form an input end of the inverter 14, and are connected to the node Ti0. The respective drains thereof are commonly connected to each other, form an output end of the inverter 14, and are connected to a node n2. The source of the transistor 14p is connected to the positive-side power supply terminal via the transistor 16 and receives the power supply voltage VGH, and the source of the transistor 14n is connected to the negative-side power supply terminal and receives the power supply voltage VGL. Namely, the inverter 14 supplies the voltage of a signal, which is obtained by inverting the phase of the high-voltage input signal Si0 received via the node Ti0, to the gate of the transistor 12 via the node n2.

In the transistor 15, the drain of itself is connected to the negative-side power supply terminal of the inverter 13, the power supply voltage VGL is received in the source thereof, and a bias voltage VBN supplied from the bias part 30A via a node n3 is received in the gate.

In the transistor 16, the drain of itself is connected to the positive-side power supply terminal of the inverter 14, the power supply voltage VGH is received in the source thereof, and a bias voltage VBP supplied from the bias part 30A via a node n4 is received in the gate.

The drive setting part 20 has a storage part (not shown) indicating voltage values of the bias voltages VBN and VBP and storing setting data for setting them to the voltage values. The drive setting part 20 generates a setting signal Cs indicating the voltage value indicated in the setting data stored in the storage part and supplies this to the bias part 30A. The drive setting part 20 may also receive setting data supplied from outside to generate a setting signal Cs indicating a voltage value indicated by the setting data, and supply the setting signal Cs to the bias part 30A.

The bias part 30A includes a bias modulation part 40A, a withstand voltage protection part 50A, and a current voltage conversion part 60A.

The bias modulation part 40A receives the power supply voltages VDD and VSS and operates in a low-voltage power supply voltage range (VSS to VDD) within the high-voltage power supply voltage range (VGL to VGH) in the buffer part 10A. The bias modulation part 40A generates a pair of currents I1A and I2A having a current value corresponding to the setting signal Cs and supplies them to the withstand voltage protection part 50A.

The withstand voltage protection part 50A performs control such that the voltage applied to an output of the bias modulation part 40A stays in the low-voltage power supply voltage range (VSS to VDD) by eliminating influence of the high-voltage power supply voltages VGH and VGL while relaying the currents I1A and I2A to the current voltage conversion part 60A.

The current voltage conversion part 60A receives the power supply voltages VGH and VGL and respectively converts the currents I1A and I2A into the bias voltages VBN and VBP having a voltage value within the high-voltage power supply voltage range (VGL to VGH). Further, the current voltage conversion part 60A supplies the bias voltage VBN to the gate of the transistor 15 via the node n3 and supplies the bias voltage to VBP the gate of the transistor 16 via the node n4.

Hereinafter, operation of the output buffer circuit 100 shown in FIG. 1 will be described.

First, when the input signal Si0L having the power supply voltage VSS corresponding to the logic level 0 is received, the level shifter 90 generates the high-voltage input signal Si0 of the logic level 0 which is obtained by level-shifting the voltage (VSS) of the input signal Si0L to the power supply voltage VGL and supplies it to the inverters 13 and 14. Accordingly, the inverter 13 supplies a signal having the power supply voltage VGH corresponding to the logic level 1 to the gate of the transistor 11, and the inverter 14 supplies a signal having the power supply voltage VGH corresponding to the logic level 1 to the gate of the transistor 12. Therefore, at this time, the transistor 11 is in an OFF state, the transistor 12 is in an ON state, and the output signal So of the logic level 0 having the power supply voltage VGL is output via the output terminal TO.

Next, when the input signal Si0L having the power supply voltage VDD corresponding to the logic level 1 is received, the level shifter 90 generates the high-voltage input signal Si0 of the logic level 1 which is obtained by level-shifting the voltage (VDD) of the input signal Si0L to the power supply voltage VGH and supplies it to the inverters 13 and 14. Accordingly, the inverter 13 supplies a signal having the power supply voltage VGL corresponding to the logic level 0 to the gate of the transistor 11, and the inverter 14 supplies a signal having the power supply voltage VGL corresponding to the logic level 0 to the gate of the transistor 12. Therefore, at this time, the transistor 11 is in the ON state, the transistor 12 is in the OFF state, and the output signal So of the logic level 1 having the power supply voltage VGH is output via the output terminal TO.

In this manner, in the output buffer circuit 100, the output control part 19A sets these transistors 11 and 12 to the ON state or the OFF state in a complementary manner by controlling the gate voltage of each of the transistors 11 and 12 in the output stage based on the high-voltage input signal Si0. At this time, the output control part 19A controls the transistors 11 and 12 in the output stage as follows at the time of voltage change of the high-voltage input signal Si0. That is, a transistor, of the transistors 11 and 12, in the ON state is quickly shifted to the OFF state by changing the gate voltage of this transistor at a rate of change corresponding to the voltage change of the input signal. Moreover, a transistor, of the transistors 11 and 12, in the OFF state is turned to the ON state by adjusting a current driving capability by changing the gate voltage of this transistor at a rate of change based on a current value controlled by the bias voltages (VBN and VBP) having the voltage value indicated by the setting signal Cs.

Specifically, when the high-voltage input signal Si0 changes from the power supply voltage VGL of the logic level 0 to the power supply voltage VGH of the logic level 1, the transistor 14n of the inverter 14 changes from the OFF state to the ON state by switching operation corresponding to the voltage change of the high-voltage input signal Si0, the gate of the transistor 12 quickly changes from the power supply voltage VGH to the power supply voltage VGL, and therefore the transistor 12 quickly changes from the ON state to the OFF state. In addition, at this time, the transistor 13n of the inverter 13 is in the ON state, the gate of the transistor 11 changes from the power supply voltage VGH to the power supply voltage VGL at a rate of change corresponding to the current value controlled by the bias voltage VBN, and the transistor 11 changes from the OFF state to the ON state at a rate of change corresponding thereto. Meanwhile, when the high-voltage input signal Si0 changes from the power supply voltage VGH of the logic level 1 to the power supply voltage VGL of the logic level 0, the transistor 13$p$ of the inverter 13 changes from the OFF state to the ON state by switching operation corresponding to the voltage change of the high-voltage input signal Si0, the gate of the transistor 11 quickly changes from the power supply voltage VGL to the power supply voltage VGH, and therefore the transistor 11 quickly changes from the ON state to the OFF state. In addition, at this time, the transistor 14$p$ of the inverter 14 is in the ON state, the gate of the transistor 12 changes from the power supply voltage VGL to the power supply voltage VGH at a rate of change corresponding to the current value controlled by the bias voltage VBP, and the transistor 12 changes from the OFF state to the ON state at a rate of change corresponding thereto.

Accordingly, at the time of voltage change of the input signal, a situation in which the transistors 11 and 12 in the output stage are turned on at the same time can be avoided. As a result, an instantaneous through-current flowing between the transistors 11 and 12 is prevented, and occurrence of EMI involved in the through-current and increase in power consumption are inhibited. In addition, the rate of change in charging and discharging currents when a load is driven can also be controlled and EMI can be reduced by controlling the rate of change in voltage of the output signal So.

In addition, when the output buffer circuit 100 has a multi-output constitution by providing a plurality of output stages (11, 12) and output control parts 19A described above, the bias part 30A generating a bias voltage for dealing with adjustment of the current driving capability described above need only be constituted in one system shared by the multi-output constitution. Moreover, since the bias modulation part 40A setting the voltage values of the bias voltages (VBN and VBP) included in the bias part 30A to an arbitrary magnitude can be constituted of low-voltage elements which operate at the power supply voltages (VDD and VSS) equal to or lower than the power supply voltages (VGH and VGL) used in the output stage (11, 12) and the output control part 19A, space-saving can be achieved by reducing addition of high-voltage elements. The bias modulation part 40A constituted of low-voltage elements can curb increase in circuit area, and the number of steps of adjusting the bias voltage can be increased.

Thus, according to the output buffer circuit 100 of the disclosure, since a means for adjusting the current driving capability by the bias voltages VBN and VBP is provided, while the current driving capability required to drive a load (low-distortion output waveform) is maintained, EMI involved in a through-current and increase in power consumption can be prevented, and EMI occurring due to charging and discharging currents involved in driving of a load can also be reduced. In addition, space-saving when a multi-output constitution is adopted can be achieved.

In FIG. 1, a constitution of the output buffer circuit 100 is shown as an example of a constitution of the output buffer circuit, but it is not limited to the constitution.

In short, the output buffer circuit according to the disclosure need only include first and second transistors serving as an output stage, a bias part, an output control part, and a drive setting part, as follows.

The first transistor (11) supplies the first high-voltage power supply voltage (VGH) to the output terminal (TO) in the case of being in the ON state in response to the voltage of the input signal received through the gate of itself. The second transistor (12) supplies the second high-voltage power supply voltage (VGL) to the output terminal (TO) in the case of being in the ON state in response to the voltage of the input signal received through the gate of itself. The bias part (30A) generates the bias voltages (VBN and VBP). The output control part (19A) shifts a transistor, of the first and second transistors, in the ON state to the OFF state at the time of voltage change of the input signal (Si0) by changing the voltage in the gate of this transistor in the ON state at a rate of change corresponding to the voltage change of the input signal. Moreover, the output control part turns a transistor, of the first and second transistors, in the OFF state to the ON state by changing the voltage in the gate of this transistor in the OFF state at a rate of change based on a current value controlled by the bias voltages (VBN and VBP). The drive setting part generates the setting signal (Cs) for designating a voltage value of the bias voltage and setting the bias voltage to the voltage value.

The bias part (30A) includes the following bias modulation part.

The bias modulation part (40A) operates upon reception of the first low-voltage power supply voltage (VDD) having a voltage value smaller than the first high-voltage power supply voltage (VGH) or equal to or smaller than that and the second low-voltage power supply voltage (VSS) having a voltage value larger than the second high-voltage power supply voltage (VGL) or equal to or larger than that, and sets the voltage values of the bias voltages (VBN and VBP) to a voltage value based on the setting signal (Cs).

Example 2

Figure 2:
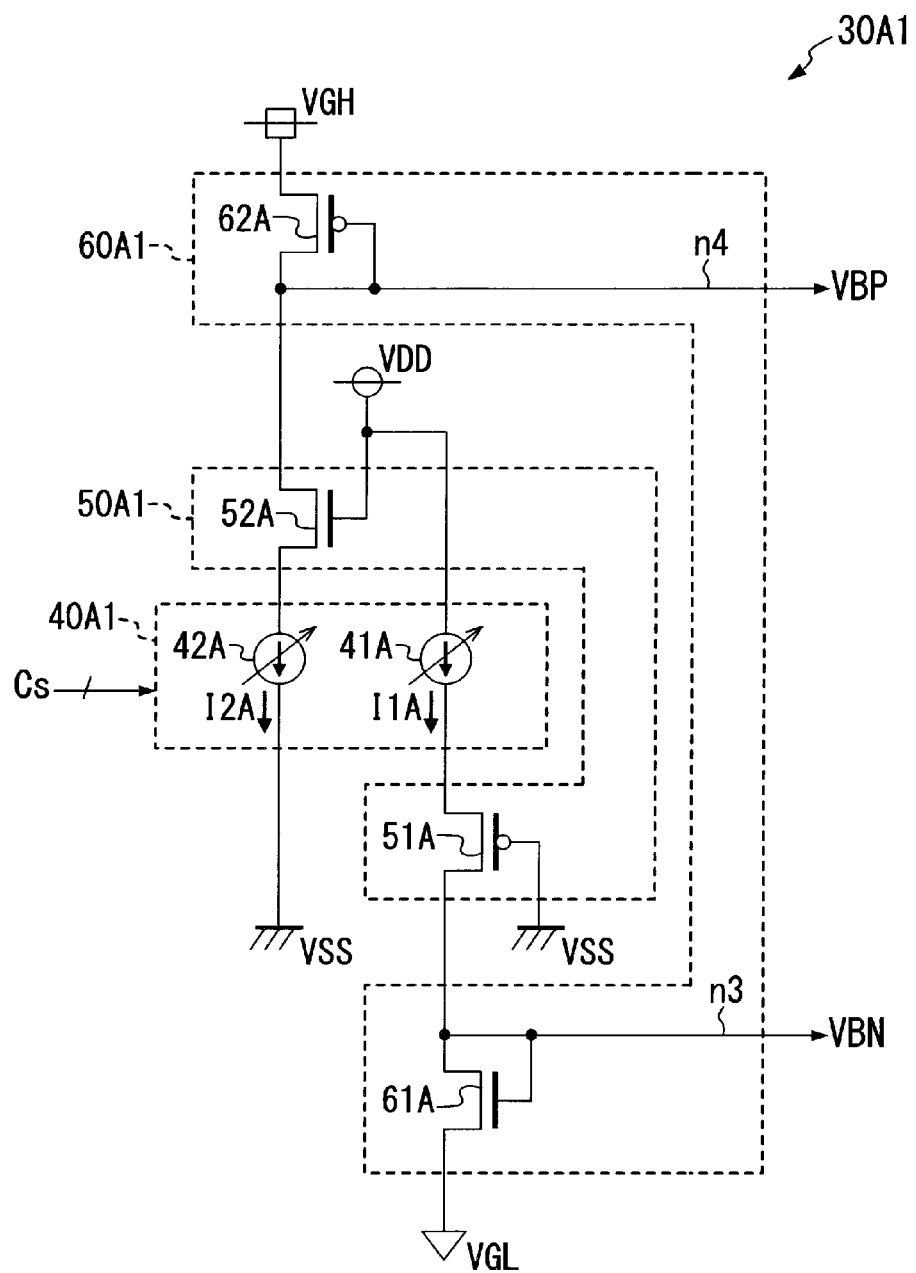
FIG. 2 is a circuit diagram showing a constitution of a bias part 30A1 as an example of a bias part 30A.

FIG. 2 is a circuit diagram showing a constitution of a bias part 30A1 as an example of the bias part 30A shown in FIG. 1.

The bias part 30A1 includes a bias modulation part 40A1, a withstand voltage protection part 50A1, and a current voltage conversion part 60A1 and generates the bias voltages VBN and VBP having a voltage value based on the setting signal Cs within the high-voltage power supply voltage range (VGL to VGH).

The bias modulation part 40A1 is constituted of low-voltage elements and includes variable current sources 41A and 42A which respectively operate within the low-voltage power supply voltage range (VSS to VDD) and generate the currents I1A and I2A having a current value based on the setting signal Cs supplied from the drive setting part 20. The variable current source 41A receives the power supply voltage VDD and sends out the foregoing current I1A, and the variable current source 42A receives the power supply voltage VSS and sends out the foregoing current I2A.

The withstand voltage protection part 50A1 includes a P-channel transistor 51A and an N-channel transistor 52A (high-voltage elements). In the transistor 51A, the power supply voltage VSS is applied to the gate of itself, and the source of itself receives the current I1A generated by the variable current source 41A. In the transistor 52A, the power supply voltage VDD is applied to the gate of itself, and the variable current source 42A is connected to the drain of itself.

The current voltage conversion part 60A1 includes an N-channel transistor 61A and a P-channel transistor 62A (high-voltage elements). In the transistor 61A, the gate and the drain of itself are connected to the drain of the transistor 51A, and the power supply voltage VGL is applied to the source of itself. In the transistor 62A, the gate and the drain of itself are connected to the drain of the transistor 52A, and the power supply voltage VGH is applied to the source of itself.

Here, a voltage generated in the gate and the drain of the transistor 61A is output as the bias voltage VBN via the node n3, and a voltage generated in the gate and the drain of the transistor 62A is output as the bias voltage VBP, via the node n4.

Due to the constitution shown in FIG. 2 described above, the currents I1A and I2A output from the bias modulation part 40A1 are supplied to the current voltage conversion part 60A1 respectively via the transistors 51A and 52A of the withstand voltage protection part 50A1.

In the transistor 51A of the withstand voltage protection part 50A1, the power supply voltage VSS is received in the gate of itself, the current I1A generated by the variable current source 41A based on the power supply voltage VDD is received in the source of itself, and this is output from the drain of itself. Accordingly, since a source voltage of the transistor 51A is maintained at a voltage higher than the voltage VSS applied to the gate by the gate-source voltage difference, the transistor 51A clamps the voltage applied to the variable current source 41A within the low-voltage power supply voltage range (VSS to VDD) and causes the current I1A described above to flow in the transistor 61A of the current voltage conversion part 60A1. The voltage applied to the gate of the transistor 51A may be changed to a voltage which deviates from the power supply voltage VSS within a range in which the variable current source 41A does not depart from the low-voltage power supply voltage range (VSS to VDD).

In addition, in the transistor 52A of the withstand voltage protection part 50A1, the power supply voltage VDD is received in the gate of itself, the current I2A generated by the variable current source 42A based on the power supply voltage VSS is received in the source of itself, and this is output from the drain of itself. Accordingly, since a source voltage of the transistor 52A is maintained at a voltage lower than the voltage VDD applied to the gate by the gate-source voltage difference, the transistor 52A clamps the voltage applied to the variable current source 41A within the low-voltage power supply voltage range (VSS to VDD) and causes the current I2A described above to flow in the transistor 62A of the current voltage conversion part 60A1. The voltage applied to the gate of the transistor 52A may be changed to a voltage which deviates from the power supply voltage VDD within a range in which the variable current source 42A does not depart from the low-voltage power supply voltage range (VSS to VDD).

In the current voltage conversion part 60A1, as shown in FIG. 2, when the diode-connected transistor 61A receives the current I1A in the drain and the gate of itself, the current I1A is converted into a voltage, and the bias voltage VBN indicating the voltage is supplied to the buffer part 10A. Moreover, in the current voltage conversion part 60A1, as shown in FIG. 2, when the diode-connected transistor 62A receives the current I2A in the drain and the gate of itself, the current I2A is converted into a voltage, and the bias voltage VBP indicating the voltage is supplied to the buffer part 10A.

As shown in FIG. 1 and FIG. 2, a first current mirror circuit may be constituted of the transistor 61A included in the bias part 30A1 and the transistor 15 included in the buffer part 10A, and a second current mirror circuit may be constituted of the transistor 62A included in the bias part 30A1 and the transistor 16 included in the buffer part 10A.

In addition, in the constitution shown in FIG. 2, increase in current flowing in the transistors 15 and 16 of the buffer part 10A may be achieved by constituting each of the transistors 61A and 62A of a plurality of diode-connected transistors which are vertically stacked.

In the withstand voltage protection part 50A1 shown in FIG. 2, when the power supply voltages VGL and VSS are equivalent to each other, the transistor 51A can be removed. In addition, when the power supply voltages VGH and VDD are equivalent to each other, the transistor 52A can be removed.

Figure 3A:
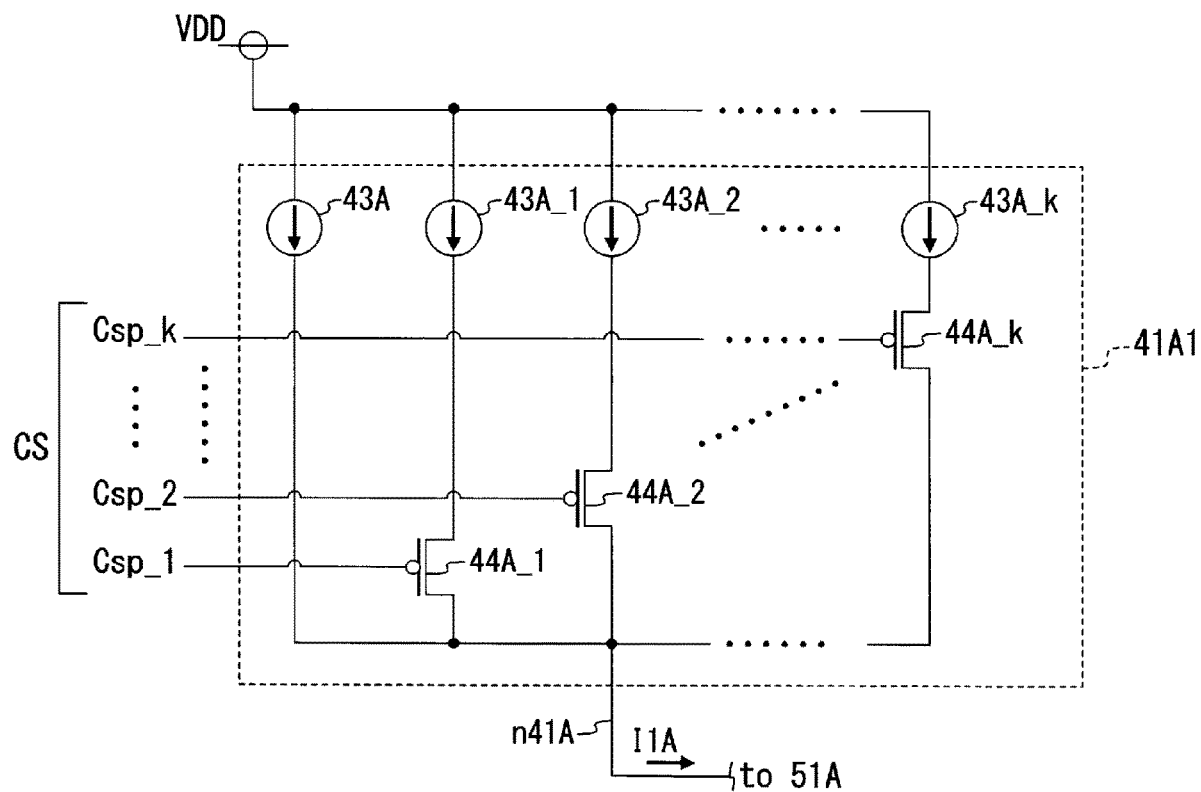
FIG. 3A is a circuit diagram showing a constitution of a variable current source 41A1 as an example of a variable current source 41A.

FIG. 3A is a circuit diagram showing a constitution of a variable current source 41A1 as an example of the variable current source 41A shown in FIG. 2.

The variable current source 41A1 is constituted of the following low-voltage elements which operate within the low-voltage power supply voltage range (VSS to VDD).

That is, for example, the variable current source 41A1 includes a plurality of constant current sources 43A and 43A_1 to 43A_k (k is an integer of 2 or larger) connected in a parallel state between a power supply terminal, to which the power supply voltage VDD is applied, and a node n41A connected to the source of the transistor 51A. Moreover, the variable current source 41A1 includes switches 44A_1 to 44A_k respectively connected to the constant current sources 43A_1 to 43A_k in a series state and controlling current supply or current cutoff with respect to the node n41A by digital setting signals Csp_1 to Csp_k included in the setting signal Cs.

Due to the constitution shown in FIG. 3A, in the variable current source 41A1, the total current of constant current sources, of the constant current sources 43A and 43A_1 to 43A_k, in a state in which a current can be supplied by the digital setting signals Csp_1 to Csp_k is generated as the current I1A. Namely, the variable current source 41A1 can variably set the current value of the current I1A by the digital setting signals Csp_1 to Csp_k.

Figure 3B:
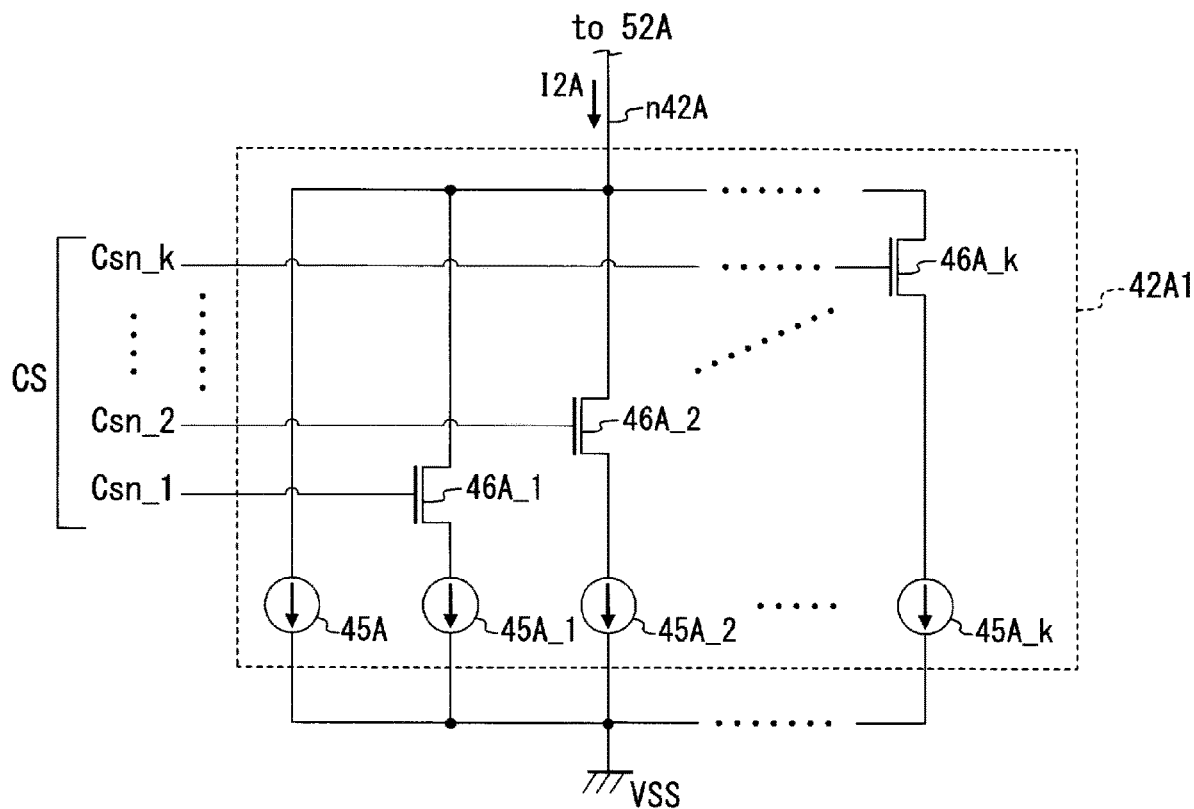
FIG. 3B is a circuit diagram showing a constitution of a variable current source 42A1 as an example of a variable current source 42A.

FIG. 3B is a circuit diagram showing a constitution of a variable current source 42A1 as an example of the variable current source 42A shown in FIG. 2.

The variable current source 42A1 is constituted of the following low-voltage elements which operate within the low-voltage power supply voltage range (VSS to VDD).

That is, for example, the variable current source 42A1 includes a plurality of constant current sources 45A and 45A_1 to 45A_k (k is an integer of 2 or larger) connected in a parallel state between a power supply terminal, to which the power supply voltage VSS is applied, and a node n42A connected to the source of the transistor 52A. Moreover, the variable current source 42A1 includes switches 46A_1 to 46A_k respectively connected to the constant current sources 45A_1 to 45A_k in a series state and controlling current supply or current cutoff with respect to the node n42A by digital setting signals Csn_1 to Csn_k included in the setting signal Cs.

Due to the constitution shown in FIG. 3B, in the variable current source 42A1, the total current of constant current sources, of the constant current sources 45A and 45A_1 to 45A_k, in a state in which a current can be supplied by the digital setting signals Csn_1 to Csn_k is generated as the current I2A. Namely, the variable current source 42A1 can variably set the current value of the current I2A by the digital setting signals Csn_1 to Csn_k.

Example 3

Figure 4:
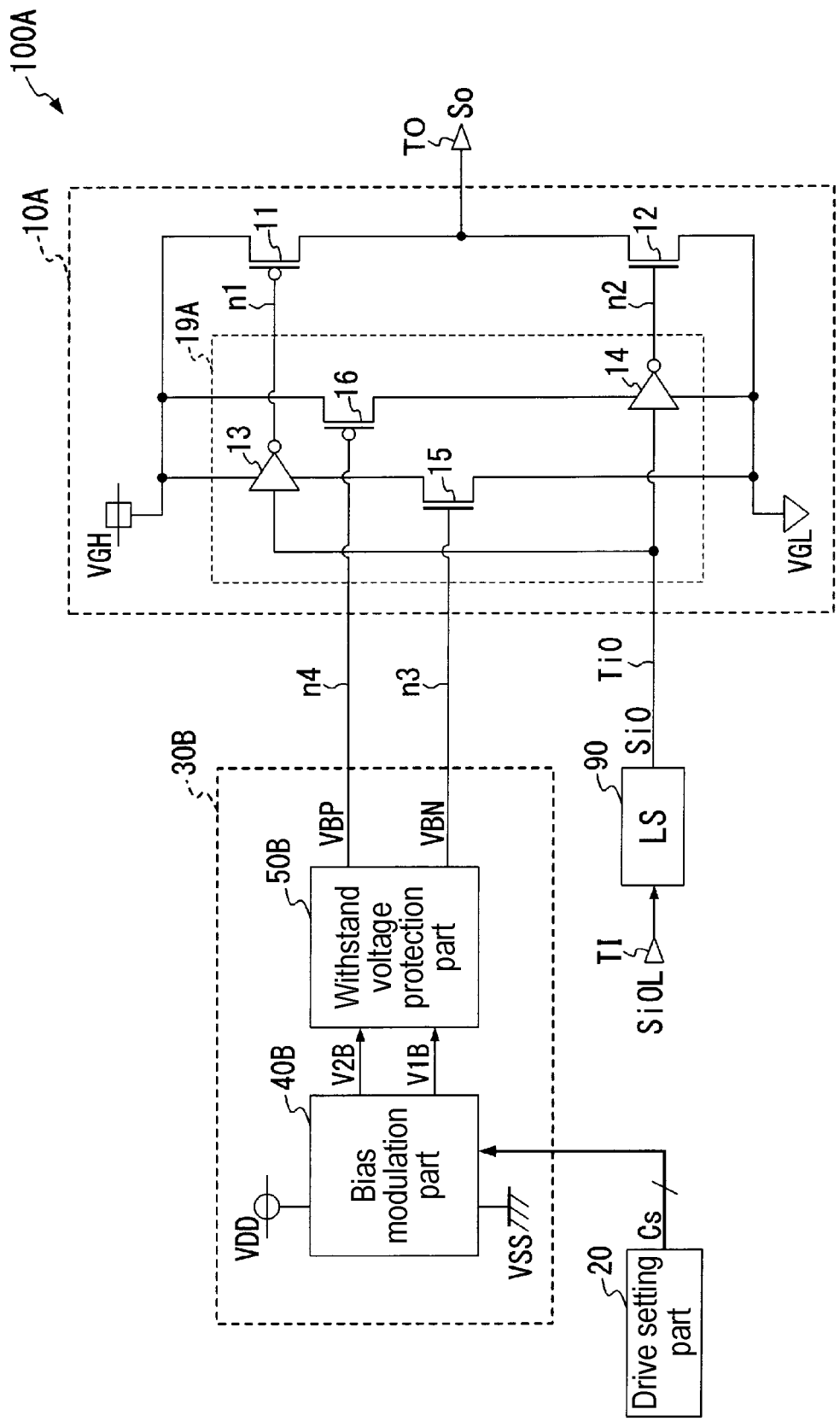
FIG. 4 is a circuit diagram showing a constitution of an output buffer circuit 100A as a modification example of the output buffer circuit 100.

FIG. 4 is a circuit diagram showing a constitution of an output buffer circuit 100A as a modification example of the output buffer circuit 100 shown in FIG. 1.

In the constitution shown in FIG. 4, the constitution is otherwise the same as that shown in FIG. 1 excluding that the bias part 30A shown in FIG. 1 is changed to a bias part 30B. Thus, hereinafter, the constitution of only the bias part 30B will be described in detail.

The bias part 30B includes a bias modulation part 40B and a withstand voltage protection part 50B and supplies the bias voltages VBN and VBP having a voltage value corresponding to the setting signal Cs to the gate of each of the transistors 15 and 16 of the buffer part 10A via the nodes n3 and n4.

The bias modulation part 40B receives the power supply voltages VDD and VSS and operates in the low-voltage power supply voltage range (VSS to VDD) within the high-voltage power supply voltage range (VGL to VGH) in the buffer part 10A. The bias modulation part 40B generates a pair of voltages V1B and V2B having a voltage value corresponding to the setting signal Cs and supplies them to the withstand voltage protection part 50B.

The withstand voltage protection part 50B performs control such that the voltages V1B and V2B do not depart from the low-voltage power supply voltage range (VSS to VDD) while having these voltages V1B and V2B as the bias voltages VBN and VBP and respectively relaying them to the buffer part 10A via the nodes n3 and n4.

Example 4

Figure 5:
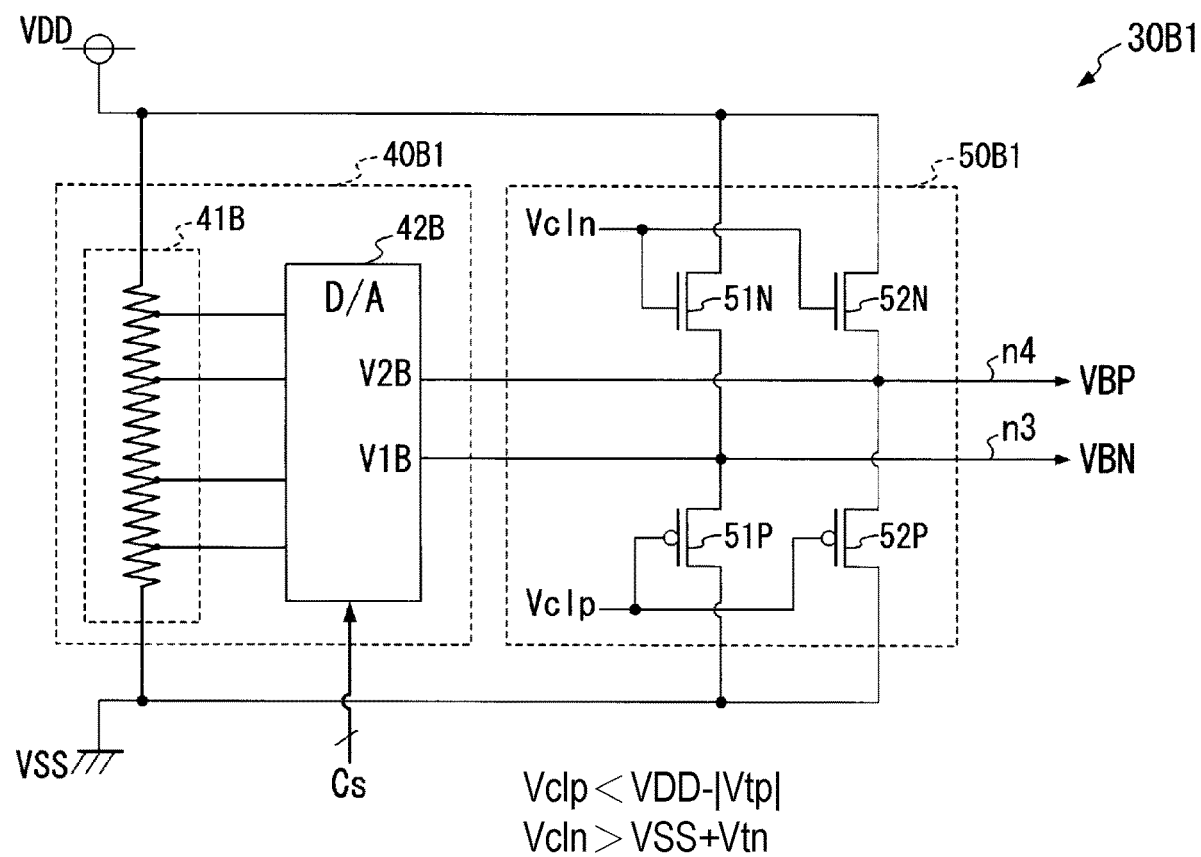
FIG. 5 is a circuit diagram showing a constitution of a bias part 30B1 as an example of a constitution of a bias part 30B.

FIG. 5 is a circuit diagram showing a constitution of a bias part 30B1 as an example of a constitution of the bias part 30B shown in FIG. 4.

As shown in FIG. 5, the bias part 30B1 includes a bias modulation part 40B1 and a withstand voltage protection part 50B1 and outputs the bias voltages VBN and VBP within the low-voltage power supply voltage range (VSS to VDD) with respect to the high-voltage power supply voltage range (VGL to VGH) in which the buffer part 10A operates.

The bias modulation part 40B1 includes a reference voltage generation part 41B and a D/A conversion part 42B.

The reference voltage generation part 41B is constituted of a ladder resistor, for example, generating a plurality of reference voltages by dividing the voltage between the power supply voltages VDD and VSS, and supplies the plurality of generated reference voltages to the D/A conversion part 42B.

The D/A conversion part 42B selects two voltages from the plurality of reference voltages based on the setting signal Cs of the drive setting part 20, and supplies each of them to the withstand voltage protection part 50I as the voltages V1B and V2B via the nodes n3 and n4.

The withstand voltage protection part 50I includes N-channel transistors 51N and 52N and P-channel transistors 51P and 52P.

As shown in FIG. 5, the power supply voltage VSS is commonly applied to the drain of each of the transistors 51P and 52P, and a predetermined control voltage Vclp is commonly applied to each of the gates. The source of the transistor 51P is connected to the node n3 which receives the voltage V1B described above, and the source of the transistor 52P is connected to the node n4 which receives the voltage V2B described above.

The control voltage Vclp described above is set as follows.

$$Vclp < VDD - |Vtp|$$

Vtp: threshold voltages of transistors 51P and 52P

Due to the constitution, if the voltage of the node n3 (n4) becomes higher than a predetermined voltage (Vc1p+|Vtp|) close to the power supply voltage VDD controlled by the control voltage Vclp, the transistor 51P (52P) is in the ON state such that the voltage of the node n3 (n4) does not exceed the power supply voltage VDD.

In addition, as shown in FIG. 5, the power supply voltage VDD is commonly applied to the drain of each of the transistors 51N and 52N, and a predetermined control voltage Vcln is commonly applied to each of the gates. The source of the transistor 51N is connected to the node n3, and the source of the transistor 52N is connected to the node n4.

The control voltage Vcln described above is set as follows.

$$Vcln > VSS + Vtn$$

Vtn: threshold voltages of transistors 51N and 52N

Due to the constitution, if the voltage of the node n3 (n4) becomes lower than a predetermined voltage (Vc1n−Vtn) close to the power supply voltage VSS controlled by the control voltage Vcln, the transistor 51N (52N) is in the ON state such that the voltage of the node n3 (n4) does not become lower than the power supply voltage VSS.

The withstand voltage protection part 50B1 shares the voltages of the nodes n3 and n4 respectively as the bias voltages VBN and VBP with the buffer part 10A.

That is, even if the bias voltages VBN and VBP fluctuate due to capacitive coupling or the like at the time of operation of the buffer part 10A, for example, the withstand voltage protection part 50I shown in FIG. 5 operates such that each of the voltage values does not depart from the low-voltage power supply voltage range (VSS to VDD).

In this manner, in setting the driving capability of the buffer part 10A which operates in the high-voltage power supply voltage range (VGL to VGH), according to the circuit constitution of the buffer part 10A as shown in FIG. 4, the voltage of each of the bias voltages VBN and VBP can be kept within the low-voltage power supply voltage range (VSS to VDD). Accordingly, both the bias modulation part 40B1 and the withstand voltage protection part 50I can be realized in a low-voltage circuit which operates in the low-voltage power supply voltage range (VSS to VDD) as shown in FIG. 5, and thus space-saving can be achieved.

Example 5

Figure 6:
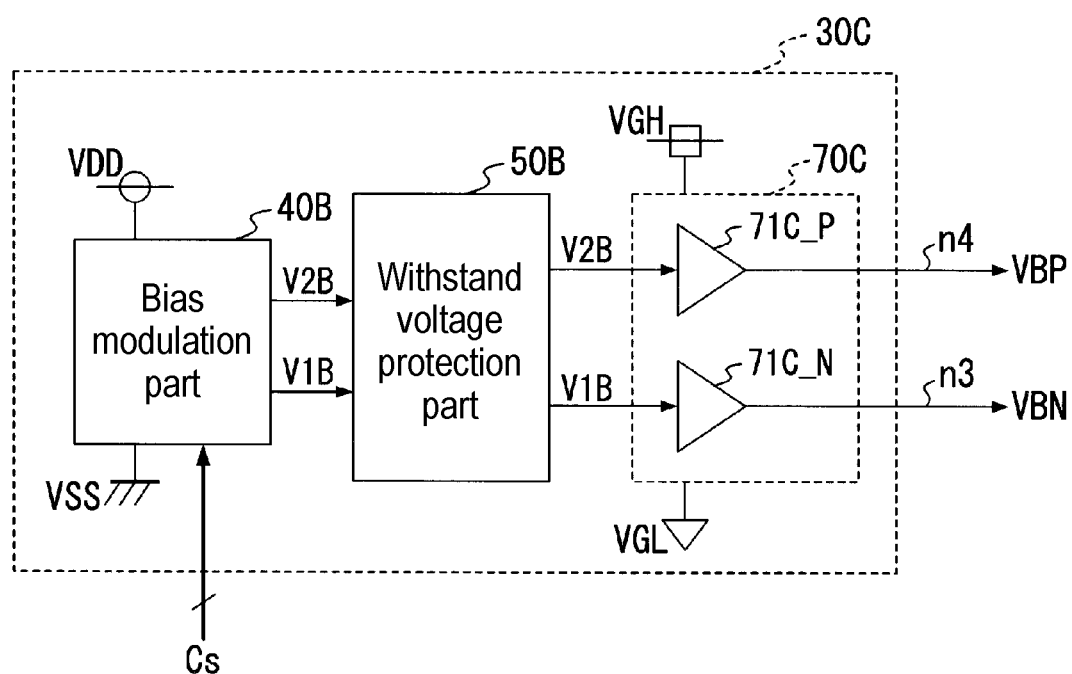
FIG. 6 is a circuit diagram showing a constitution of a bias part 30C as a modification example of the bias part 30B.

FIG. 6 is a circuit diagram showing a constitution of a bias part 30C as a modification example of the bias part 30B shown in FIG. 4.

As shown in FIG. 6, the bias part 30C is realized by adding an amplification part 70C to the bias modulation part 40B and the withstand voltage protection part 50B Shown in FIG. 4 or 5.

The withstand voltage protection part 50B shown in FIG. 6 performs control such that the voltages V1B and V2B do not depart from the low-voltage power supply voltage range (VSS to VDD) while relaying the voltages V1B and V2B supplied from the bias modulation part 40B to the amplification part 70C.

The amplification part 70C includes amplifiers 71C_N and 71C_P which operate at the power supply voltages VGH and VGL. The amplifier 71C_N outputs, as the bias voltage VBN, a voltage obtained by extending a voltage value of the voltage V1B supplied from the bias modulation part 40B via the withstand voltage protection part 50B to the high-voltage power supply voltage range (VGL to VGH). The amplifier 71C_P outputs, as the bias voltage VBP, a voltage obtained by extending a voltage value of the voltage V2B supplied from the bias modulation part 40B via the withstand voltage protection part 50B to the high-voltage power supply voltage range (VGL to VGH).

Figure 7:
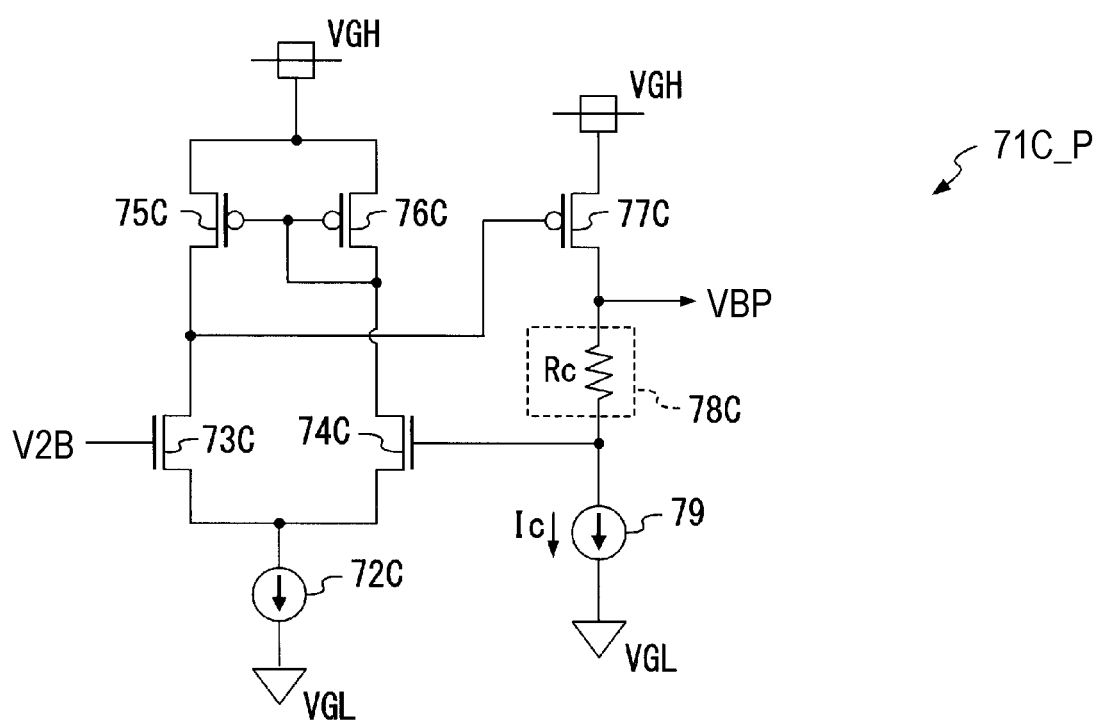
FIG. 7 is a circuit diagram showing an example of an internal constitution of each of amplifiers 71C_P and 71C_N.

FIG. 7 is a circuit diagram showing an example of an internal constitution of the amplifier 71C_P.

The amplifier 71C_P having the constitution shown in FIG. 7 receives the voltage V2B in the low-voltage power supply voltage range (VSS to VDD) and outputs a voltage obtained by extending the voltage value thereof to the power supply voltage VGH side as the bias voltage VBP.

As shown in FIG. 7, the amplifier 71C_P is an operational amplifier including a constant current source 72C, N-channel transistors 73C and 74C, P-channel transistors 75C to 77C, a load resistance 78C, and a constant current source 79.

In FIG. 7, one end of the constant current source 72C is connected to the source of each of the transistors 73C and 74C forming a differential pair. The power supply voltage VGL is applied to the other end of the constant current source 72C. The voltage V2B is supplied to the gate of the transistor 73C, and the drain of the transistor 75C and the gate of the transistor 77C are connected to the drain thereof. The drain and the gate of a transistor 76C and the gate of the transistor 75C are connected to the drain of the transistor 74C. The power supply voltage VGH is applied to the source of each of the transistors 75C and 76C. The power supply voltage VGH is applied to the source of the transistor 77C, and one end of the load resistance 78C is connected to the drain thereof. The gate of the transistor 74C and one end of the constant current source 79 are connected to the other end of the load resistance 78C. The power supply voltage VGL is applied to the other end of the constant current source 79. In place of the power supply voltage VGL, VSS may be applied to the other end of each of the constant current sources 72C and 79.

According to the constitution shown in FIG. 7, the bias voltage VBP having a voltage value, which is expressed as follows, $$VBP=V2B+Ic \cdot Rc$$

Ic: current of constant current source 79
Rc: resistance value of load resistance is generated in the drain of the transistor 77C. That is, the amplifier 71C_P shown in FIG. 7 generates the bias voltage VBP obtained by extending the input voltage V2B to the power supply voltage VGH side.

Regarding the amplifier 71C_N, with the constitution similar to that in FIG. 7, the bias voltage VBN obtained by extending the input voltage V1B to the power supply voltage VGL side may be generated.

Example 6

Figure 8:
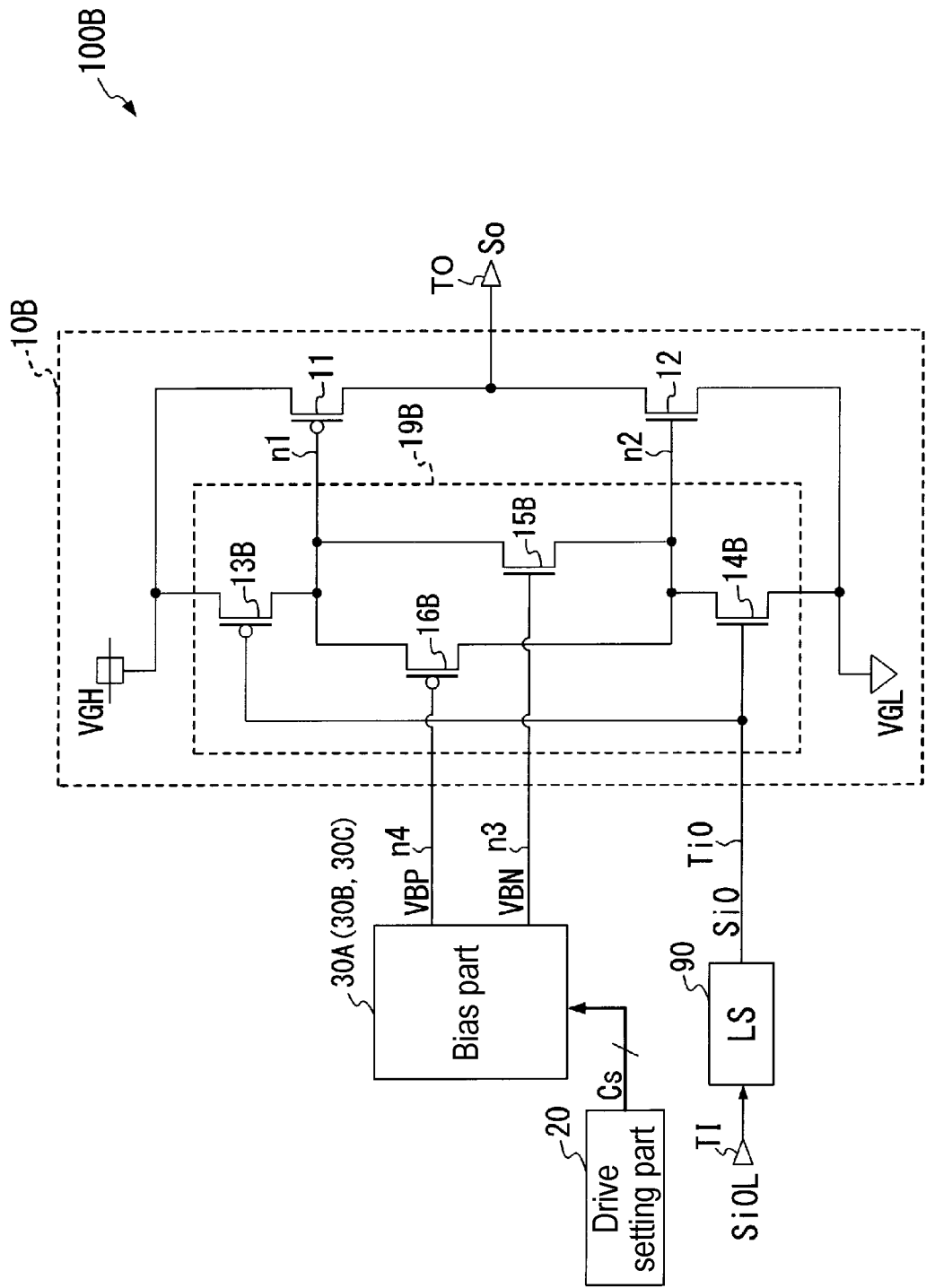
FIG. 8 is a circuit diagram showing a constitution of an output buffer circuit 100B as a modified example of the output buffer circuit 100.

FIG. 8 is a circuit diagram showing a constitution of an output buffer circuit 100B as a modified example of the output buffer circuit 100 shown in FIG. 1.

In the constitution shown in FIG. 8, a buffer part 10B is employed in place of the buffer part 10A shown in FIG. 1, and other constitutions (20, 30A to 30C, and 90) are the same as those shown in FIG. 1 to FIG. 7.

The buffer part 10B is constituted of high-voltage elements and is constituted of the following high-voltage elements which operate in the high-voltage power supply voltage range (VGL to VGH).

That is, the buffer part 10B includes an output stage constituted of the P-channel transistor 11 and the N-channel transistor 12, and an output control part 19B controlling a gate voltage of each of these transistors 11 and 12.

The power supply voltage VGH is applied to the source of the transistor 11, and the power supply voltage VGL is applied to the source of the transistor 12.

The drains of the transistors 11 and 12 are connected to the output terminal TO, and a binary (logic level 0 or 1) signal having the voltages (VGL and VGH) generated in the output terminal TO is output as the output signal So.

The output control part 19B has a constitution different from that of the output control part 19A shown in FIG. 1 but has similar effects of controlling the gate voltage of each of the transistors 11 and 12 in the output stage based on the high-voltage input signal Si0 and the bias voltages VBN and VBP.

As shown in FIG. 8, the output control part 19B includes N-channel transistors 14B and 15B and P-channel transistors 13B and 16B.

The high-voltage input signal Si0 is supplied to the gate of each of the transistors 13B and 14B. The power supply voltage VGH is applied to the source of the transistor 13B, and the drain thereof is connected to each of the source of the transistor 16B, the drain of the transistor 15B, and the gate of the transistor 11 via the node n1. The power supply voltage VGL is applied to the source of the transistor 14B, and the drain thereof is connected to each of the drain of the transistor 16B, the source of the transistor 15B, and the gate of the transistor 12 via the node n2.

The bias voltage VBN generated by the bias part 30A (30B or 30C) is supplied to the gate of the transistor 15B, and the bias voltage VBP generated by the bias part 30A (30B or 30C) is supplied to the gate of the transistor 16B.

Transistors having a current driving capability greater than that of the transistors 15B and 16B are used as the transistors 13B and 14B.

Hereinafter, operation of the buffer part 10B will be described. Hereinafter, operation in which the high-voltage input signal Si0 changes from the state of the logic level 0 (VGL) to the state of the logic level 1 (VGH) and changes to the state of the logic level 0 (VGL) again will be described.

First, while the high-voltage input signal Si0 is in the state of the logic level 0 (VGL), the transistor 13B is in the ON state, and the power supply voltage VGH is supplied to the node n1. Accordingly, the transistor 11 is in the OFF state. In addition, the transistor 14B is in the OFF state, and the node n2 is cut off from the power supply voltage VGL. Accordingly, the voltage of the node n1 becomes the power supply voltage VGH and the gate-source voltage of the transistor 16B exceeds the threshold voltage, and therefore the transistor 16B is in the ON state. Thus, the voltage (VGH) of the node n1 is supplied to the node n2 via the transistor 16B, and the voltage of the node n2 becomes the power supply voltage VGH. As a result, since the gate-source voltage of the transistor 12 exceeds the threshold voltage, the transistor 12 is in the ON state, and the output signal So of the logic level 0 (VGL) is output from the output terminal TO. Since the gate-source voltage becomes lower than the threshold voltage due to increase in voltage of the node n2, the transistor 15B is in the OFF state.

Thereafter, the voltage of the high-voltage input signal Si0 starts to increase, and when it exceeds the threshold voltage of the transistor 14B, the transistor 14B is in the ON state and supplies the power supply voltage VGL to the node n2. In addition, as the voltage of the high-voltage input signal Si0 increases, the current driving capability of the transistor 14B increases. Meanwhile, the current driving capability of the transistor 13B decreases, and the transistor 13B shifts to the OFF state. At this time, since the current driving capability of the transistor 14B is greater than the current driving capability of the transistor 16B, the voltage of the node n2 relatively steeply decreases from the state of the power supply voltage VGH and turns to the power supply voltage VGL. Accordingly, the transistor 12 transitions to the OFF state. Further, the gate-source voltage of the transistor 15B exceeds the threshold voltage, and the transistor 15B is in the ON state. As a result, the transistor 15B supplies the voltage of the node n2 to the node n1 with the current driving capability corresponding to a current value controlled by the bias voltage VBN and gently decreases the voltage of the node n1. In addition, accordingly, the gate-source voltage of the transistor 16B falls below the threshold voltage, and the transistor 16B shifts to the OFF state.

Further, if the gate-source voltage of the transistor 11 exceeds the threshold voltage, the transistor 11 is in the ON state, and the power supply voltage VGH is supplied to the output terminal TO. As a result, the voltage of the output signal So gently increases and shifts from the state of the logic level 0 (VGL) to the state of the logic level 1 (VGH).

Thereafter, if the voltage of the high-voltage input signal Si0 starts to decrease and exceeds the threshold voltage of the transistor 13B, the transistor 13B is in the ON state, and the power supply voltage VGH is supplied to the node n1. In addition, as the voltage of the high-voltage input signal Si0 decreases, the current driving capability of the transistor 13B increases. Meanwhile, the current driving capability of the transistor 14B deteriorates and shifts to the OFF state. At this time, since the current driving capability of the transistor 13B is greater than the current driving capability of the transistor 15B, the voltage of the node n1 relatively steeply increases from the state of the power supply voltage VGL and turns to the power supply voltage VGH. Accordingly, the transistor 11 transitions to the OFF state. Further, the gate-source voltage of the transistor 16B exceeds the threshold voltage, and the transistor 16B is in the ON state. As a result, the transistor 16B supplies the voltage (VGH) of the node n1 to the node n2 with the current driving capability corresponding to a current value controlled by the bias voltage VBP and gently increases the voltage of the node n2. In addition, accordingly, the gate-source voltage of the transistor 15B falls below the threshold voltage, and the transistor 15B shifts to the OFF state.

Further, if the gate-source voltage of the transistor 12 exceeds the threshold voltage, the transistor 12 is in the ON state, and the power supply voltage VGL is supplied to the output terminal TO. As a result, the voltage of the output signal So gently decreases and shifts from the state of the logic level 1 (VGH) to the state of the logic level 0 (VGL).

As described above in detail, in the buffer part 10B, when the transistors (11 and 12) are shifted from the ON state to the OFF state in the output stage, the gate voltage of the transistor in the output stage is controlled by the transistors (13B and 14B) having a high current driving capability. Meanwhile, when the transistors (11 and 12) in the output stage are shifted from the OFF state to the ON state, the gate voltage of the transistor in the output stage gently fluctuates via the transistors (15B and 16B) having a current driving capability corresponding to the current value controlled by the bias voltages (VBN and VBP).

Accordingly, after one transistor 11 (12) in the output stage is shifted to the OFF state in accordance with the high-voltage input signal Si0, the other transistor 12 (11) is shifted to the ON state so that a situation in which both are turned on at the same time is avoided and generation of a through-current is curbed.

Here, since the number of elements (six transistors) constituting the output control part 19B shown in FIG. 8 is smaller than the number of elements (eight transistors) in the output control part 19A shown in FIG. 1, extra space-saving can be achieved. In addition, since the output control part 19B has a small input capacitance as seen from the node Ti0 compared to the output control part 19A, quick response can be achieved. Moreover, the output control part 19B shown in FIG. 8 can more reliably curb occurrence of an excessive through-current at the time of voltage change of the high-voltage input signal Si0 than the output control part 19A shown in FIG. 1.

Example 7

Figure 9A:
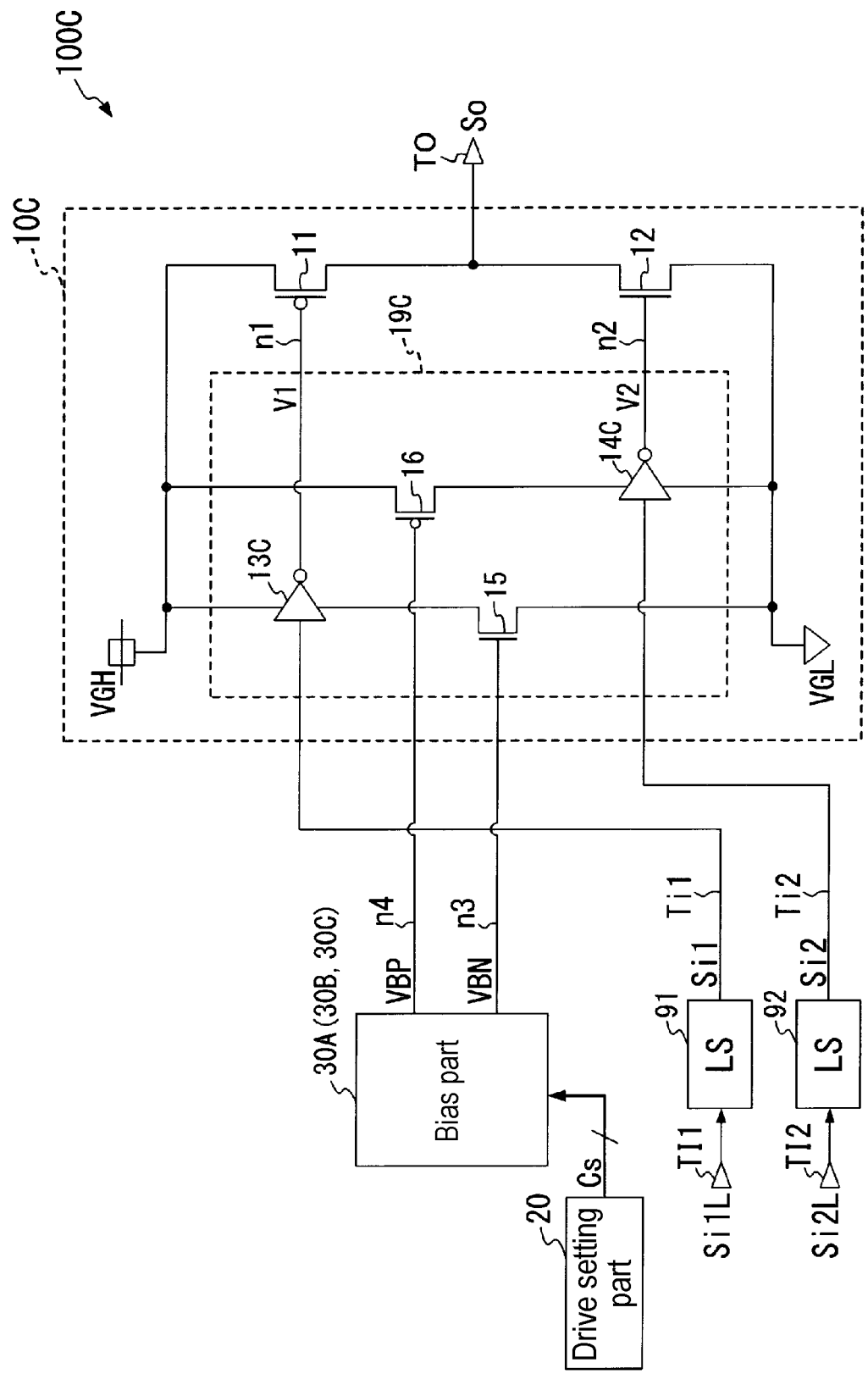
FIG. 9A is a circuit diagram showing a constitution of an output buffer circuit 100C as another modified example of the output buffer circuit 100.

FIG. 9A is a circuit diagram showing a constitution of an output buffer circuit 100C as another modified example of the output buffer circuit 100 shown in FIG. 1.

The output buffer circuit 100C is a non-inverting buffer which receives low-voltage input signals Si1L and Si2L of two systems having phases slightly shifted from each other and outputs the high-voltage output signal So of one system. Here, the input signal Si1L is a binary signal alternately repeating the state of the power supply voltage VSS (logic level 0) and the state of the power supply voltage VDD (logic level 1), and the input signal Si2L is a binary signal having a slightly earlier voltage rise timing and a slightly later fall timing than the input signal Si1L.

In the constitution shown in FIG. 9A, the constitutions (20 and 30A to 30C) are otherwise the same as those shown in FIG. 1 to FIG. 7 excluding that the buffer part 10A shown in FIG. 1 is changed to a buffer part 10C and the level shifter 90 of one system shown in FIG. 1 is changed to level shifters 91 and 92 of two systems to deal with inputs of the input signals Si1L and Si2L of two systems.

In addition, in the buffer part 10C shown in FIG. 9A, the constitutions (11, 12, 15, and 16) are otherwise the same as those shown in FIG. 1 excluding that the inverters 13 and 14 shown in FIG. 1 are changed to inverters 13C and 14C.

The inverter 13C receives a high-voltage input signal Si1 via a node Ti1. When the high-voltage input signal Si1 is in the logic level 0 (VGL), the power supply voltage VGH is supplied to the node n1, and when it is in the logic level 1 (VGH), the power supply voltage VGL is supplied to the node n1 via the transistor 15. That is, the inverter 13C supplies a voltage of a phase-inverted signal to the gate of the transistor 11 via the node n1. The inverter 13C is the same as the inverter 13 in FIG. 1 except for the input signal.

The inverter 14C receives a high-voltage input signal Si2 via a node Ti2. When the high-voltage input signal Si2 is in the logic level 0 (VGL), the power supply voltage VGH is supplied to the node n2 via the transistor 16, and when it is in the logic level 1 (VGH), the power supply voltage VGL is supplied to the node n2. That is, the inverter 14C supplies a voltage of a phase-inverted signal to the gate of the transistor 12 via the node n2. The inverter 14C is the same as the inverter 14 in FIG. 1 except for the input signal.

The level shifter 91 receives the input signal Si1L described above via an input terminal TI1 and converts the input signal Si1L into the high-voltage input signal Si1 which is obtained by level-shifting the amplitude thereof to the high-voltage range (VGL to VGH). The level shifter 91 supplies the high-voltage input signal Si1 to the inverter 13C via the node Ti1.

The level shifter 92 receives the input signal Si2L described above via an input terminal TI2 and converts the input signal Si2L into the high-voltage input signal Si2 which is obtained by level-shifting the amplitude thereof to the high-voltage range (VGL to VGH). The level shifter 92 supplies the high-voltage input signal Si2 to the inverter 14C via the node Ti2.

Figure 9B:
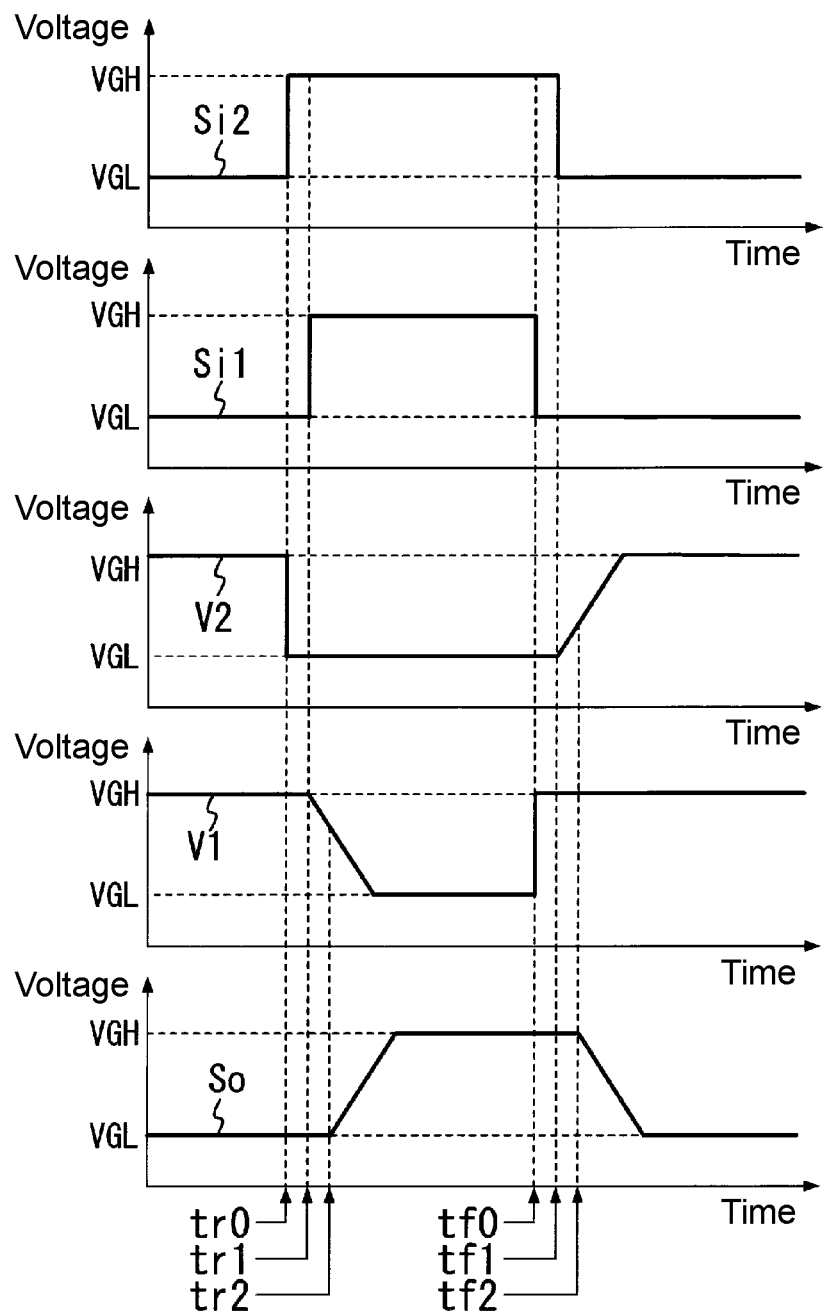
FIG. 9B is a time chart showing waveforms of voltages V1 and V2 and an output signal So respectively generated in nodes n1 and n2 of a buffer part 10C when high-voltage input signals Si1 and Si2 are received.

FIG. 9B is a time chart showing waveforms of voltages V1 and V2 and the output signal So respectively generated in the nodes n1 and n2 of the buffer part 10C when the high-voltage input signals Si1 and Si2 are received.

First, while the high-voltage input signals Si1 and Si2 are in the state of the logic level 0 (VGL), the inverters 13C and 14C respectively supply signals of the logic level 1 (VGH) having inverted phases to the nodes n1 and n2. Thus, since both the voltage V1 of the node n1 and the voltage V2 of the node n2 become the power supply voltage VGH, the transistor 11 is in the OFF state, and the transistor 12 is in the ON state, the output signal So of the logic level 0 (VGL) is output from the output terminal TO.

Thereafter, at a time point tr0 shown in FIG. 9B, a voltage of the high-voltage input signal Si2 shifts from the state of the logic level 0 (VGL) to the state of the logic level 1 (VGH). Accordingly, the inverter 14C supplies the power supply voltage VGL to the node n2, the voltage V2 of the node n2 shifts to the power supply voltage VGL, and the transistor 12 is in the OFF state.

Further, at a time point tr1 later than the time point tr0, the voltage of the high-voltage input signal Si1 shifts from the state of the logic level 0 (VGL) to the state of the logic level 1 (VGH). Accordingly, the inverter 13C supplies the power supply voltage VGL to the node n1 via the transistor 15. At this time, the voltage V1 of the node n1 gently decreases toward the power supply voltage VGL at a rate of change corresponding to the current value controlled by the bias voltage VBN applied to the gate of the transistor 15. In the meantime, at a time point tr2 when the gate-source voltage of the transistor 11 based on the voltage V1 exceeds the threshold voltage, the transistor 11 is in the ON state, and the power supply voltage VGH is supplied to the output terminal TO. As a result, the voltage of the output signal So gently increases and shifts from the state of the logic level 0 (VGL) to the state of the logic level 1 (VGH).

Thereafter, at a time point tf0 shown in FIG. 9B, first, the high-voltage input signal Si1 shifts from the state of the logic level 1 (VGH) to the logic level 0 (VGL). Accordingly, the inverter 13C supplies the power supply voltage VGH to the node n1, the voltage V1 of the node n1 shifts to the power supply voltage VGH, and the transistor 11 is in the OFF state. Further, at a time point to later than the time point tf0, the high-voltage input signal Si2 shifts from the state of the logic level 1 (VGH) to the logic level 0 (VGL). Accordingly, the inverter 14C supplies the power supply voltage VGH to the node n2 via the transistor 16. At this time, the voltage V2 of the node n2 gently increases toward the power supply voltage VGH at a rate of change corresponding to the current value controlled by the bias voltage VBP applied to the gate of the transistor 16. In the meantime, at a time point tf2 when the gate-source voltage of the transistor 12 based on the voltage V2 exceeds the threshold voltage, the transistor 12 is in the ON state, and the power supply voltage VGL is supplied to the output terminal TO. As a result, the voltage of the output signal So gently decreases and shifts from the state of the logic level 1 (VGH) to the state of the logic level 0 (VGL).

In this manner, in the output buffer circuit 100C, the inverters (13C and 14C) are individually controlled using two input signals (Si1L, Si2L, Si1, and Si2). At this time, as shown in FIG. 9B, a period, during which both the transistors 11 and 12 constituting the output stage are in the OFF state at the time of voltage change of the input signal by slightly shifting the phases of both the input signals, is provided.

Thus, according to the output buffer circuit 100C shown in FIG. 9A, a through-current generated between the transistors 11 and 12 in the output stage can be completely cut off.

Regarding the output buffer circuit 100B in FIG. 8 as well, effects of completely cutting off a through-current generated between the transistors 11 and 12 in the output stage can be realized by applying a constitution similar to that in FIG. 9A, as shown in FIG. 9B. Specifically, it can be easily realized by performing change such that the high-voltage input signals Si1 and Si2 is FIG. 9A are supplied to the gate of each of the transistors 13B and 14B of the output buffer circuit 100B in FIG. 8.

Example 8

Figure 10:
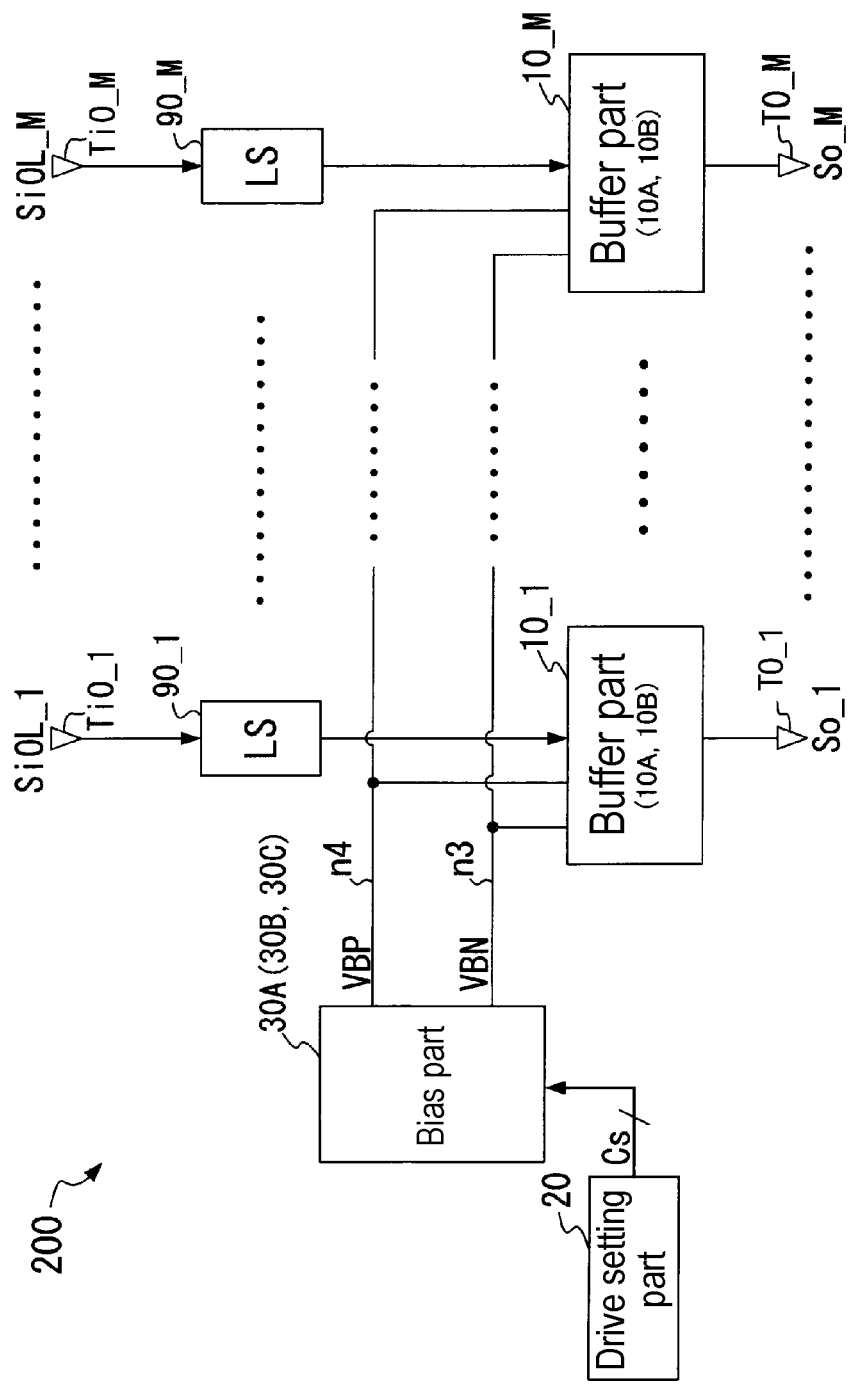
FIG. 10 is a block diagram showing a constitution of a multi-output buffer device 200 having M output channels.

FIG. 10 is a block diagram showing a constitution of a multi-output buffer device 200 having M (M is an integer of 2 or larger) output channels.

The multi-output buffer device 200 receives binary (logic level 0 or 1) input signals Si0L_1 to Si0L_M each having a voltage changing with a low-voltage amplitude (VSS to VDD) respectively in input terminal Ti0_1 to Ti0_M and outputs voltages obtained by respectively extending and amplifying them to a high-voltage amplitude (VGL to VGH) from output terminals T0_1 to T0_M as output signals So_1 to So_M. Then, the input signals Si0L_1 to Si0L_M may be signals with different phases.

The multi-output buffer device 200 has a multi-channel output buffer circuit provided with M (M is an integer of 2 or larger) systems each having the buffer part 10A (10B) shown in FIG. 1 (FIG. 8) and the level shifter 90 together with the bias part 30A, 30B or 30C and the drive setting part 20 shown in FIG. 1, 4, or 6.

That is, the multi-output buffer device 200 receives the input signals Si0L_1 to Si0L_M with level shifters 90_1 to 90_M each having the same constitution as that of the level shifter 90 shown in FIG. 1 or 8.

The level shifters 90_1 to 90_M supply the generated M high-voltage input signals Si0 to buffer parts 10_1 to 10_M each constituted of the buffer part 10A shown in FIG. 1 or the buffer part 10B shown in FIG. 8.

The buffer parts 10_1 to 10_M output the output signals So_1 to So_M, which are output from each of them, via the output terminals T0_1 to T0_M.

The bias part 30A (30B or 30C) supplies the bias voltage VBN based on the setting signal Cs supplied from the drive setting part 20 to the gate of the transistor 15 (15B) of each of the buffer parts 10_1 to 10_M via the node n3. Moreover, the bias part 30A (30B or 30C) supplies the bias voltage VBP based on the setting signal Cs supplied from the drive setting part 20 to the gate of the transistor 16 (16B) of each of the buffer parts 10_1 to 10_M via the node n4.

Bypass capacitors for curbing fluctuation of the bias voltages VBN and VBP and making them stable may be connected to the nodes n3 and n4.

In this manner, the multi-output buffer device 200 requires the buffer parts 10_1 to 10_M and the level shifters 90_1 to 90_M for M systems each having the same constitution as that of the buffer part 10A shown in FIG. 1 or the buffer part 10B shown in FIG. 8 with respect to M output channels.

However, since the drive setting part 20 and the bias part 30A (30B or 30C) can be shared by the buffer parts 10_1 to 10_M of the M systems, only one system is required regardless of the number of output channels, and thus space-saving of the device in its entirety can be achieved.

Example 9

Figure 11:
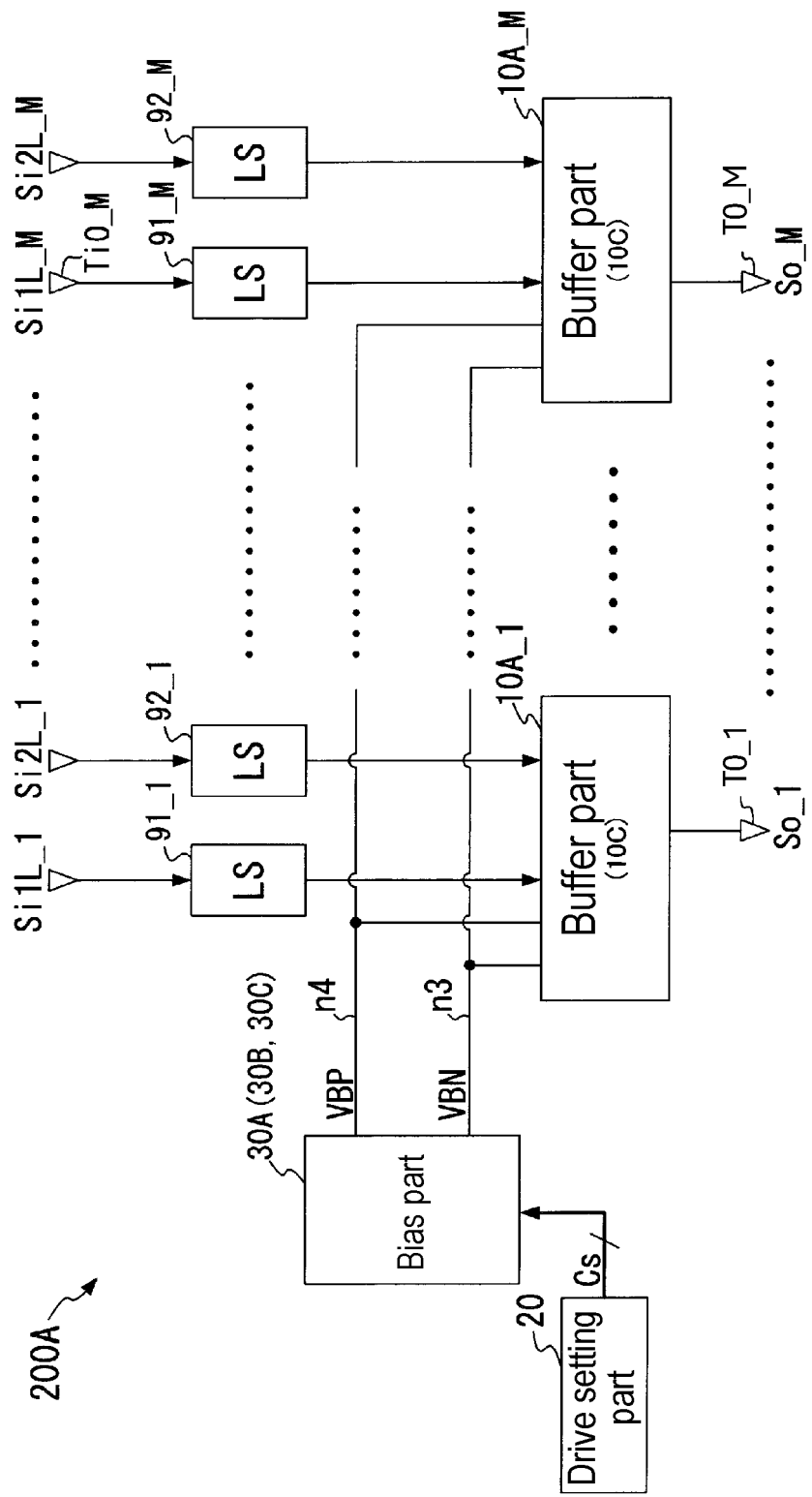
FIG. 11 is a block diagram showing a constitution of a multi-output buffer device 200A having M output channels.

FIG. 11 is a block diagram showing a constitution of a multi-output buffer device 200A as another constitution of a multi-output buffer device having M output channels.

The multi-output buffer device 200A has a multi-channel output buffer circuit provided with M (M is an integer of 2 or larger) systems each having the buffer part 10C and the level shifters 91 and 92 shown in FIG. 9A together with the bias part 30A, 30B or 30C shown in FIG. 9A and the drive setting part 20.

That is, level shifters 91_1 to 91_M each having the same constitution as that of the level shifter 91 supply M high-voltage input signals Si1 obtained by individually level-shifting input signals Si1L_1 to Si1L_M to buffer parts 10A_1 to 10A_M each having the same constitution as that of the buffer part 10C shown in FIG. 9A. In addition, level shifters 92_1 to 92_M each having the same constitution as that of the level shifter 92 supply M high-voltage input signals Si2 obtained by individually level-shifting input signals Si2L_1 to Si2L_M to buffer parts 10A_1 to 10A_M.

The buffer parts 10A_1 to 10A_M output the output signals So_1 to So_M, which are output from each of them, via the output terminals T0_1 to T0_M.

The bias part 30A (30B or 30C) supplies the bias voltage VBN based on the setting signal Cs supplied from the drive setting part 20 to the gate of the transistor 15 of each of the buffer parts 10A_1 to 10A_M via the node n3. Moreover, the bias part 30A (30B or 30C) supplies the bias voltage VBP based on the setting signal Cs supplied from the drive setting part 20 to the gate of the transistor 16 of each of the buffer parts 10A_1 to 10A_M via the node n4.

Bypass capacitors for curbing fluctuation of the bias voltages VBN and VBP and making them stable may be connected to the nodes n3 and n4.

In this manner, the multi-output buffer device 200A requires the buffer parts 10A_1 to 10A_M, the level shifters 91_1 to 91_M, and the level shifters 92_1 to 92_M for M systems each having the same constitution as that of the buffer part 10C shown in FIG. 9A with respect to M output channels. However, since the drive setting part 20 and the bias part 30A (30B or 30C) can be shared by the buffer parts 10A_1 to 10A_M of the M systems, only one system is required and thus space-saving of the device in its entirety can be achieved.

Example 10

Figure 12:
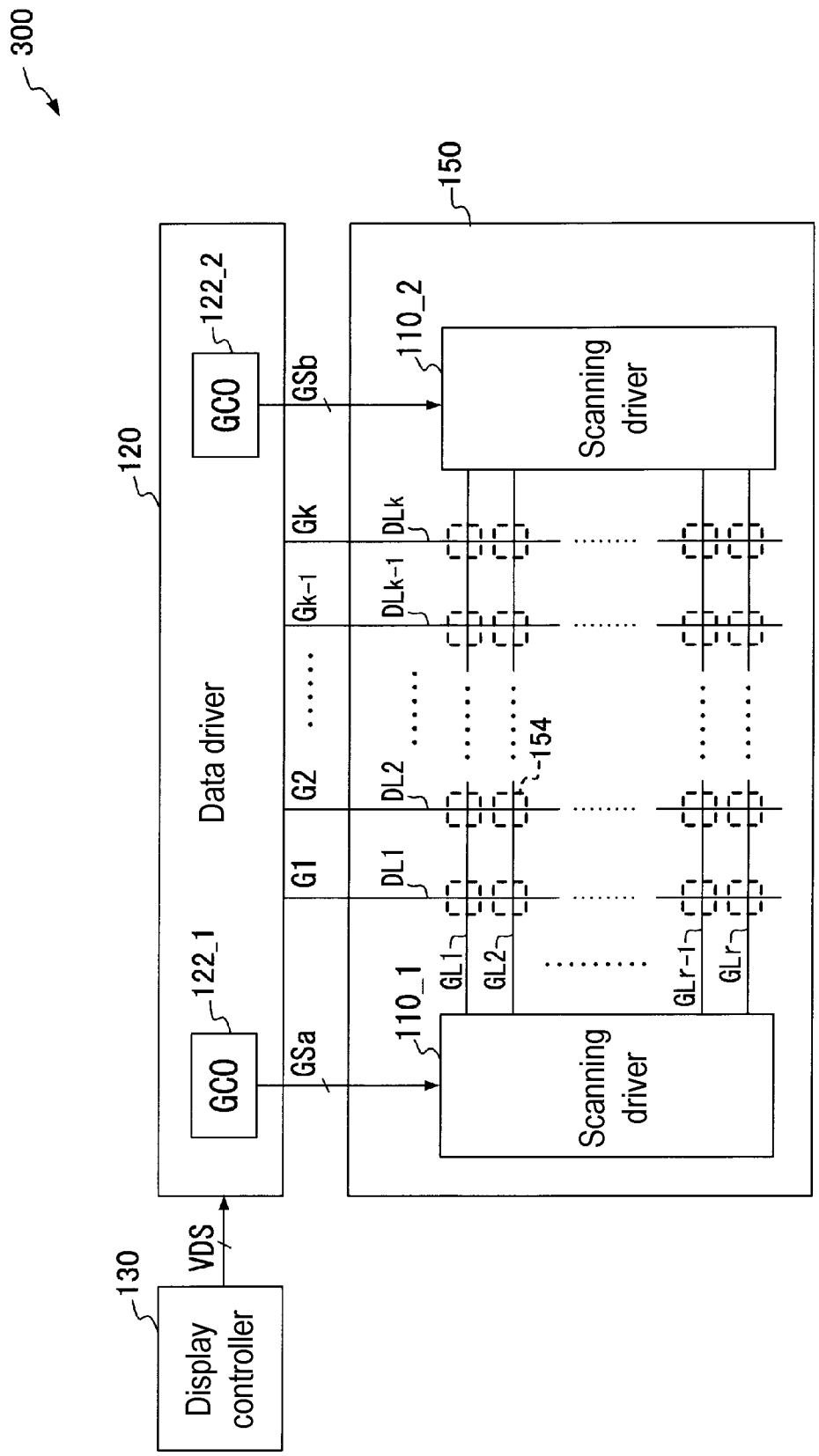
FIG. 12 is a block diagram showing a schematic constitution of an active matrix-type display device 300.

FIG. 12 is a block diagram showing a schematic constitution of an active matrix-type display device 300.

As shown in FIG. 12, the display device 300 includes a display controller 130, a data driver 120, and a display panel 150.

In the display panel 150, gate lines GL1 to GLr (r is an integer of 2 or larger) each disposed in a horizontal direction of a screen, and data lines DL1 to DLk (k is an integer of 2 or larger) disposed in a manner intersecting the gate lines are formed. A display cell 154 for dealing with pixels is formed in each of the intersection parts of each of the gate lines GL1 to GLr and each of the data lines DL1 to DLk.

Moreover, scanning drivers 110_1 and 110_2 formed integrally with the display panel 150 are disposed on the display panel 150. The scanning drivers 110_1 and 110_2 are built as thin-film transistor circuits which are formed integrally with the pixels and wirings on an insulating substrate made of glass, plastic, or the like.

The data driver 120 receives video data signal VDS sent out from the display controller 130, generates drive signals G1 to Gk each having a voltage value corresponding to the luminance level based on the video data signal VDS, and supplies them to the data lines DL1 to DLk. Moreover, the data driver 120 supplies r gate timing signals GSa and r gate timing signals GSb synchronized with in each of horizontal synchronization signals included in the video data signal VDS to each of the scanning drivers 110_1 and 110_2. Each of the gate timing signals GSa and GSb is a high-voltage pulse signal with an amplitude of 30 to 40 volts, for example.

The data driver 120 is normally formed using a silicon IC and is mounted on the display panel 150 using chip-on-glass (COG), chip-on-film (COF), or the like. Here, when the data driver 120 is constituted of a plurality of IC chips, the video data signal VDS corresponding to data lines for dealing with driving of each of them and various kinds of control signals are supplied from the display controller 130 to each of the IC chips. At this time, when the screen of the display device 300 has a relatively small size, the display controller 130 may be built into the data driver 120. In that case, the video data signal VDS is supplied from the system side to the data driver 120.

The scanning driver 110_1 is connected to one end of each of the gate lines GL1 to GLr, and the scanning driver 110_2 is connected to the other end of each of the gate lines GL1 to GLr. The scanning driver 110_1 sequentially generates gate selection signal at the timing of each of the gate timing signals GSa supplied from the data driver 120 and supplies each of them to one end of each of the gate lines GLr to GL1. The scanning driver 110_2 sequentially generates gate selection signals at the timing of each of the gate timing signals GSb supplied from the data driver 120 and supplies each of them to the other end of each of the gate lines GLr to GL1.

Incidentally, the data driver 120 includes a gate control signal output circuit 122_1 outputting the r gate timing signals GSa described above and a gate control signal output circuit 122_2 outputting the r gate timing signals GSb.

At this time, the gate control signal output circuit 122_1 (122_2) includes the multi-output buffer device 200 or 200A shown in FIG. 10 or 11, and the r gate timing signals GSa (GSb) are output from the multi-output buffer device 200 or 200A.

FIG. 12 shows a constitution in which k data lines DL1 to DLk of the display panel 150 are driven by the data driver 120 having k output terminals, but it may be provided with a multiplexer circuit (not shown) including a selector switch for switching a drive signal of one output in the data driver to a plurality of data lines in time divisions. In this case, the number of outputs of the data driver becomes the number obtained by dividing the k data lines by the number of time divisions. In addition, the data driver includes a multiplexer selection signal output circuit supplying a multiplexer selection signal for sequentially selecting the selector switch of the multiplexer circuit on the display panel to the panel. This multiplexer selection signal output circuit outputs high-voltage pulse signals similar to the gate control signal output circuit and may include a circuit similar to the gate control signal output circuit 122_1 (122_2) in the data driver as the multiplexer selection signal output circuit.

Thus, the bias voltages VBN and VBP are adjusted using the setting signal Cs of the drive setting part 20, and the rate of change in voltage of the output signal So output from the output buffer circuit is optimized. Therefore, occurrence of EMI involved in a through-current or increase in power consumption can be curbed, EMI occurring due to charging and discharging currents involved in driving of a load can also be reduced, and the gate timing signals GSa (GSb) having a current driving capability required for low power consumption (low-distortion output waveform) can be obtained with a space-saving constitution.

Example 11

Figure 13:
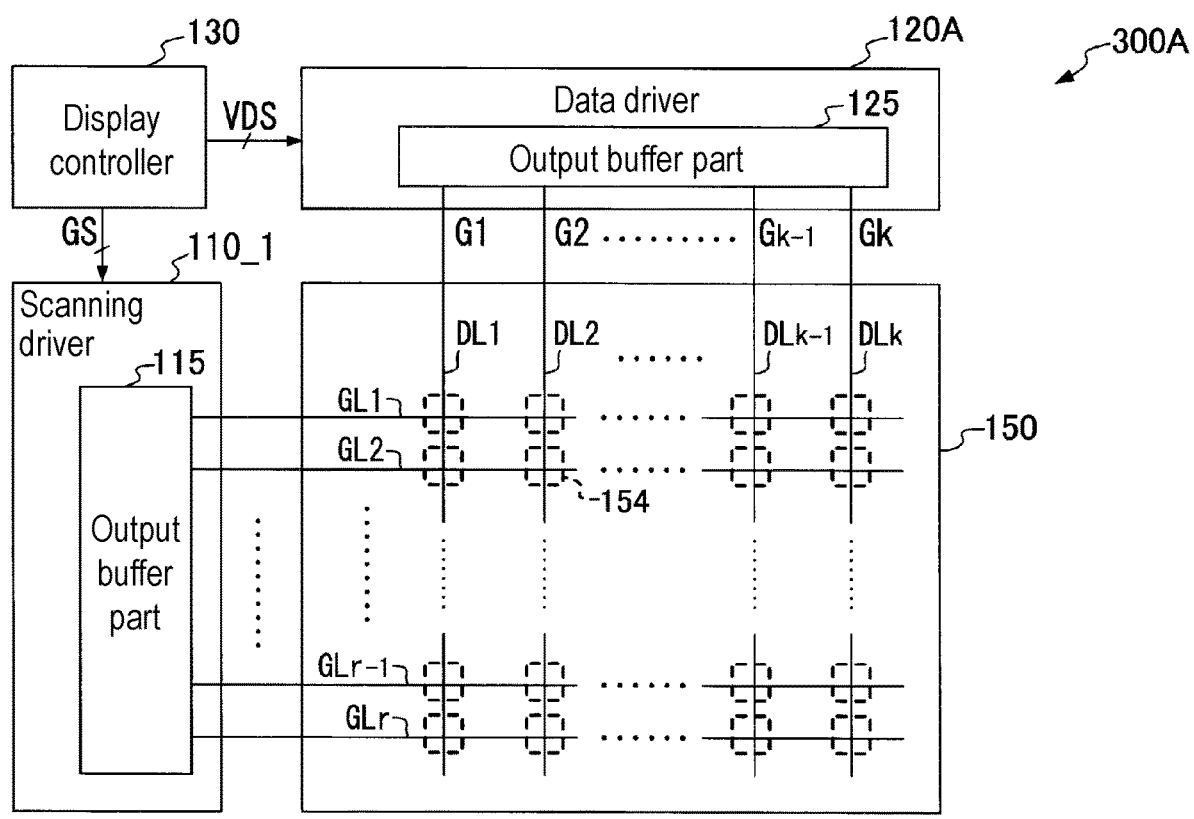
FIG. 13 is a block diagram showing a schematic constitution of a passive matrix-type display device 300A.

FIG. 13 is a block diagram showing a schematic constitution of a passive matrix-type display device 300A.

As shown in FIG. 13, the display device 300A includes the display controller 130, the scanning driver 110_1, a data driver 120A, and the display panel 150.

In the display panel 150, the scanning lines GL1 to GLr (r is an integer of 2 or larger) each disposed in the horizontal direction of the screen, and the data lines DL1 to DLk (k is an integer of 2 or larger) disposed in a manner intersecting the scanning lines are formed. The display cell 154 for dealing with pixels is formed in each of the intersection parts of each of the scanning lines GL1 to GLr and each of the data lines DL1 to DLk.

The display controller 130 supplies the video data signal VDS including horizontal and vertical synchronization signals, various kinds of control signals, and a series of pixel data pieces indicating the luminance level of each pixel to the data driver 120A. Moreover, the display controller 130 supplies r gate timing signals GS synchronized with each of the horizontal synchronization signals included in the video data signal VDS to the scanning driver 110_1.

The data driver 120A generates the drive pulse signals G1 to Gk each having a pulse width corresponding to the luminance level based on the video data signal VDS and supplies them to the data lines DL1 to DLk.

The scanning driver 110_1 is connected to one end of each of the gate lines GL1 to GLr, sequentially generates r scanning selection pulse signals at the timing of the scanning timing signals GS described above, and supplies each of them to one end of each of the scanning lines GLr to GL1.

Incidentally, the data driver 120A includes an output buffer part 125 outputting the drive pulse signals G1 to Gk described above, and the scanning driver 110_1 includes an output buffer part 115 outputting r gate selection pulse signals described above.

At this time, the output buffer part 115 is constituted of the multi-output buffer device 200 or 200A shown in FIG. 10 or 11, and r scanning selection pulse signals are output from the multi-output buffer device 200 or 200A. In addition, the output buffer part 125 is also constituted of the multi-output buffer device 200 or 200A shown in FIG. 10 or 11, and the drive pulse signals G1 to Gk are output from the multi-output buffer device 200 or 200A.

Accordingly, the bias voltages VBN and VBP are adjusted, and the rate of change in voltage of the output signal So output from the output buffer circuit is optimized. Therefore, occurrence of EMI involved in a through-current or increase in power consumption can be curbed, EMI occurring due to charging and discharging currents involved in driving of a load can also be reduced, and r scanning selection pulse signals having a current driving capability (low-distortion output waveform) required for low power consumption and the drive pulse signals G1 to Gk can be output by means of a space-saving constitution.

Example 12

Figure 14:
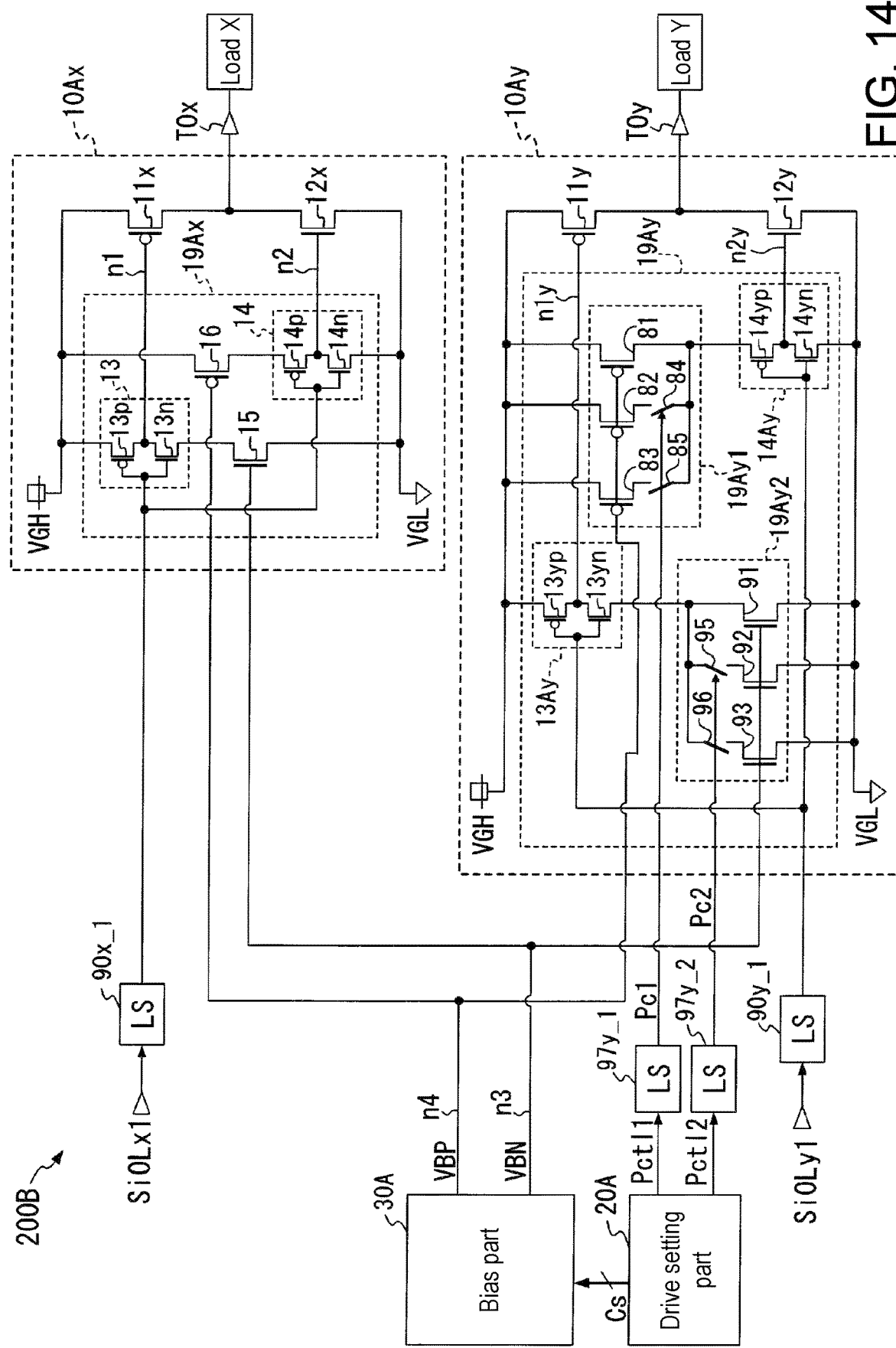
FIG. 14 is a block diagram showing a constitution of a multi-output buffer device 200B having buffer parts 10Ax and 10Ay that respectively drive two loads X and Y requiring different current driving capabilities.

FIG. 14 is a block diagram showing a constitution of a multi-output buffer device 200B having a pair of buffer parts 10Ax and 10Ay that respectively drive two loads X and Y requiring different current driving capabilities.

As shown in FIG. 14, the multi-output buffer device 200B includes a buffer part 10Ax that drives a load X connected to an output terminal TOx, a buffer part 10Ay that drives a load Y connected to an output terminal TOy, a bias part 30A, a drive setting part 20A, and level shifters 90$x$_1, 90$y$_1, 97$y$_1, and 97$y$_2.

In FIG. 14, the bias part 30A is the same as the bias part 30A shown in FIG. 1, for example, and the buffer part 10Ax has the same internal constitution as the buffer part 10A shown in FIG. 1, for example, so detailed descriptions thereof will be omitted.

The level shifter 90$x$_1 receives a binary (logic level 0 or 1) input signal Si0Lx1, which has a voltage that changes with a low-voltage amplitude (VSS to VDD), as an input signal for driving the load X. The level shifter 90$x$_1 supplies, to the buffer part 10Ax, a high-voltage input signal obtained by level-shifting the amplitude of the input signal Si0Lx1 to a high-voltage amplitude (VGL to VGH).

In response to the high-voltage input signal, the buffer part 10Ax supplies an output signal having a waveform like the output signal So shown in FIG. 9B, for example, to the load X via the output terminal TOx.

The drive setting part 20A generates a setting signal Cs, for example, in the same manner as the drive setting part 20 shown in FIG. 1, and supplies the setting signal Cs to the bias part 30A. Further, the drive setting part 20A supplies, to the level shifters 97$y$_1 and 97$y$_2, respectively, driving capability control signals Pctl1 and Pctl2 each being composed of two bits, for example, and setting the driving capability of the buffer part 10Ay.

The level shifter 97$y$_1 generates a two-bit driving capability control signal Pc1 obtained by level-shifting the amplitude of the driving capability control signal Pctl1 to a high-voltage amplitude (VGL to VGH), and supplies the driving capability control signal Pc1 to the buffer part 10Ay.

The level shifter 97$y$_2 generates a two-bit driving capability control signal Pc2 obtained by level-shifting the amplitude of the driving capability control signal Pctl2 to a high-voltage amplitude (VGL to VGH), and supplies the driving capability control signal Pc2 to the buffer part 10Ay.

The level shifter 90$y$_1 receives a binary (logic level 0 or 1) input signal Si0Ly1, which has a voltage that changes with a low-voltage amplitude (VSS to VDD), as an input signal for driving the load Y. The level shifter 90$y$_1 supplies, to the buffer part 10Ay, a high-voltage input signal obtained by level-shifting the amplitude of the input signal Si0Ly1 to a high-voltage amplitude (VGL to VGH).

In response to the high-voltage input signal, the buffer part 10Ay supplies an output signal having a waveform like the output signal So shown in FIG. 9B, for example, to the load Y via the output terminal TOy.

The buffer part 10Ay is constituted of high-voltage elements and is constituted of the following high-voltage elements which operate in a high-voltage power supply voltage range (VGL to VGH).

That is, the buffer part 10Ay includes an output stage constituted of a P-channel transistor 11y and an N-channel transistor 12y, and an output control part 19Ay controlling a gate voltage of each of the transistors 11y and 12y. The output control part 19Ay includes inverters 13Ay and 14Ay, a discharge speed control part 19Ay1, and a charge speed control part 19Ay2.

The inverter 13Ay is constituted of an N-channel transistor 13yn and a P-channel transistor 13yp, and the inverter 14Ay is constituted of an N-channel transistor 14yn and a P-channel transistor 14yp. The inverters 13Ay and 14Ay both receive, at their respective gates, a high-voltage input signal level-shifted to the high-voltage power supply voltage amplitude of VGL to VGH by the level shifter 90y_1. The source of the transistor 13yp of the inverter 13Ay is connected to a positive-side power supply terminal to receive a power supply voltage VGH, and the source of the transistor 13yn is connected to the charge speed control part 19Ay2. The source of the transistor 14yn of the inverter 14Ay is connected to a negative-side power supply terminal to receive a power supply voltage VGL, and the source of the transistor 14yp is connected to the discharge speed control part 19Ay1.

In response to the driving capability control signal Pc1, the discharge speed control part 19Ay1 controls the discharge speed for the load Y connected to the output terminal TOy. The discharge speed control part 19Ay1 includes switch elements 84 and 85 and P-channel transistors 81 to 83.

The power supply voltage VGH is applied to the source of each of the transistors 81 to 83, and a bias voltage VBP is applied to the gate of each of the transistors 81 to 83. The drain of the transistor 81 is connected to the source of the transistor 14yp of the inverter 14Ay, and the drains of the transistors 82 and 83 are connected to the source of the transistor 14yp via the switch elements 84 and 85, respectively.

A size (W/L) ratio of each of the transistors 81 to 83 is as follows in the case where the sizes of the transistors 81 and 82 are set to 1, for example,

1:1:2.

The switch element 84 is set to an ON state or an OFF state according to a first bit of the driving capability control signal Pc1, and connects the drain of the transistor 82 to the source of the transistor 14yp of the inverter 14Ay when in the ON state.

The switch element 85 is set to an ON state or an OFF state according to a second bit of the driving capability control signal Pc1, and connects the drain of the transistor 83 to the source of the transistor 14yp of the inverter 14Ay when in the ON state.

FIG. 15A is a diagram showing the states of the switch elements 84 and 85 corresponding to the driving capability control signal Pc1, and the magnitude (ratio) of the current flowed by the discharge speed control part 19Ay1.

The discharge speed control part 19Ay1 is capable of switching, in four stages (settings 1 to 4), the magnitude of the current supplied to a node n2y when the transistor 12y transitions to the ON state according to combinations of the ON and OFF states of the switch elements 84 and 85 based on the driving capability control signal Pc1 as shown in FIG. 15A. At this time, the larger the current is, the higher the discharge speed for the load Y is. In contrast, the smaller the current is, the lower the discharge speed for the load Y is.

With the above constitution, the discharge speed control part 19Ay1 is capable of switching, according to the driving capability control signal Pc1, the current value supplied to the node n2y in response to the bias voltage VBP. Accordingly, the buffer part 10Ay is capable of adjusting the speed during discharge of the load Y performed via the transistor 12y, and optimizing EMI reduction and the output waveform to the load Y.

In response to the driving capability control signal Pc2, the charge speed control part 19Ay2 controls the charge speed for the load Y connected to the output terminal TOy. The charge speed control part 19Ay2 includes switch elements 95 and 96 and P-channel transistors 91 to 93.

The power supply voltage VGL is applied to the source of each of the transistors 91 to 93, and a bias voltage VBN is applied to the gate of each of the transistors 91 to 93. The drain of the transistor 91 is connected to the source of the transistor 13yn of the inverter 13Ay, and the drains of the transistors 92 and 93 are connected to the source of the transistor 13yn via the switch elements 95 and 96, respectively.

A size (W/L) ratio of each of the transistors 91 to 93 is as follows in the case where the sizes of the transistors 91 and 92 are set to 1, for example,

1:1:2.

The switch element 95 is set to an ON state or an OFF state according to a first bit of the driving capability control signal Pc2, and connects the drain of the transistor 92 to the source of the transistor 13yn of the inverter 13Ay when in the ON state.

The switch element 96 is set to an ON state or an OFF state according to a second bit of the driving capability control signal Pc2, and connects the drain of the transistor 93 to the source of the transistor 13yn of the inverter 13Ay when in the ON state.

FIG. 15B is a diagram showing the states of the switch elements 95 and 96 corresponding to the driving capability control signal Pc2, and the magnitude (ratio) of the current flowed by the charge speed control part 19Ay2 accompanying these states.

The charge speed control part 19Ay2 is capable of switching, in four stages (settings 1 to 4), the magnitude of the current drawn from a node my when the transistor 11y transitions to the ON state according to combinations of the ON and OFF states of the switch elements 95 and 96 based on the driving capability control signal Pc2 as shown in FIG. 15B. At this time, the larger the current is, the higher the charge speed for the load Y is. In contrast, the smaller the current is, the lower the charge speed for the load Y is.

With the above constitution, the charge speed control part 19Ay2 is capable of switching, according to the driving capability control signal Pc2, the current value drawn from the node n1y in response to the bias voltage VBN. Accordingly, the buffer part 10Ay is capable of adjusting the speed during charge of the load Y performed via the transistor 11y, and optimizing EMI reduction and the output waveform to the load Y.

Thus, in the buffer part 10Ay including the discharge speed control part 19Ay 1 and the charge speed control part 19Ay2, by adjusting its own current driving capability according to the driving capability control signal (Pctl1 and Pctl2), it is possible to properly perform driving also for the load Y, which requires a current driving capability different from the load X, while sharing the bias part 30A.

In the example shown in FIG. 14, the pair of buffer parts 10Ax and 10Ay are shared by the bias part 30A of one system, but a plurality of buffer parts 10Ax and a plurality of buffer parts 10Ay may also be shared by the bias part 30A of one system.

Example 13

Figure 16:
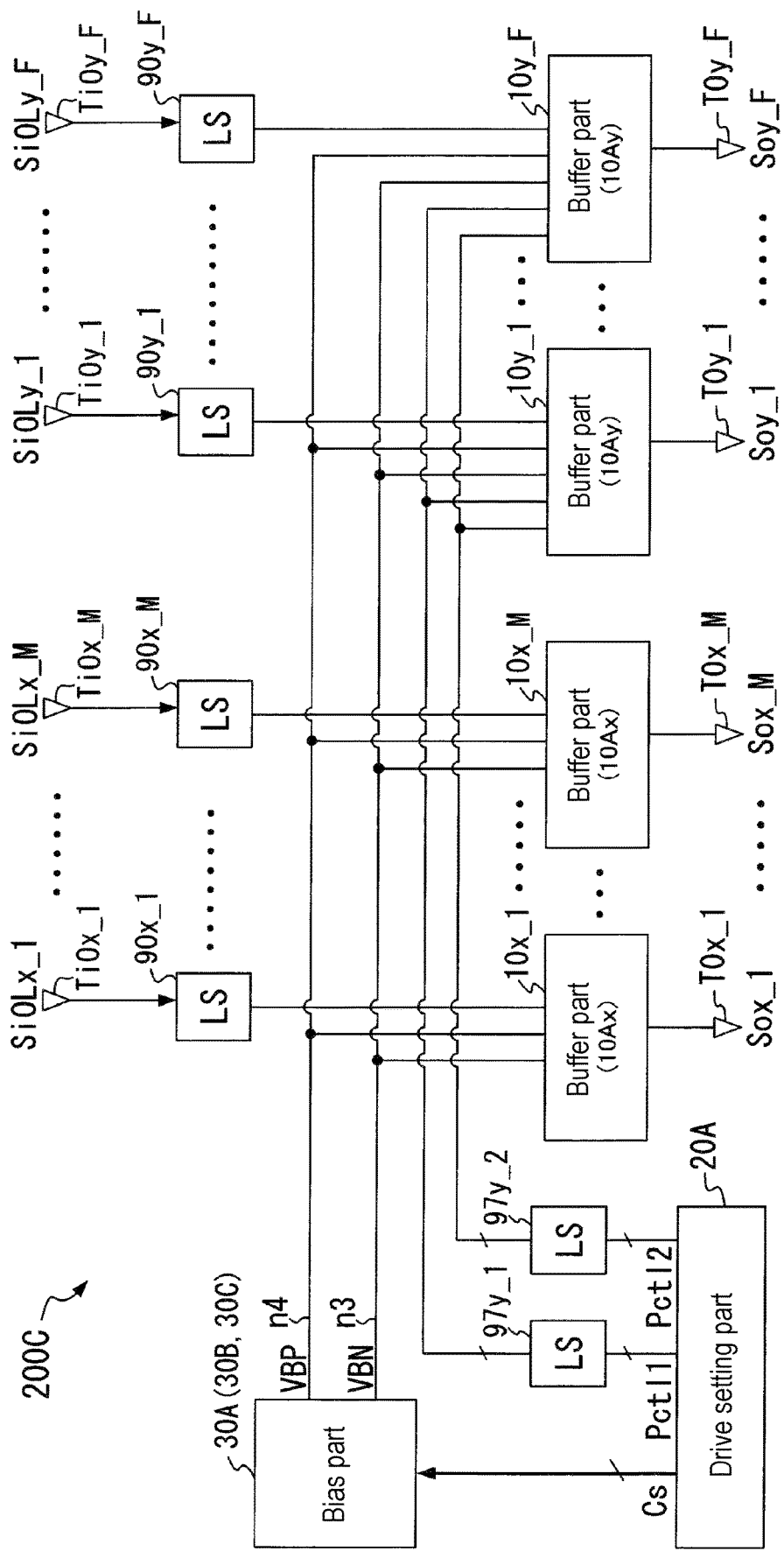
FIG. 16 is a block diagram showing a constitution of a multi-output buffer device 200C as still another example of the multi-output buffer device.

FIG. 16 is a block diagram showing a constitution of a multi-output buffer device 200C as still another example of the multi-output buffer device made in view of such points.

As shown in FIG. 16, the multi-output buffer device 200C includes buffer parts 10x_1 to 10x_M (M is an integer of 2 or larger) each having the same constitution as the buffer part 10Ax shown in FIG. 14, and buffer parts 10y_1 to 10y_F (F is an integer of 2 or larger) having the same constitution as the buffer part 10Ay shown in FIG. 14.

Furthermore, the multi-output buffer device 200C includes input terminals Ti0x_1 to Ti0x_M that individually receive input signals Si0Lx_1 to Si0Lx_M, input terminals Ti0y_1 to Ti0y_F that individually receive input signals Si0Ly_1 to Si0Ly_F, level shifters 90x_1 to 90x_M, and level shifters 90y_1 to 90y_F.

With respect to the input signals Si0Lx_1 to Si0Lx_M, the level shifters 90x_1 to 90x_M individually generate high-voltage input signals obtained by level-shifting respective amplitudes to a high-voltage amplitude (VGL to VGH), and supply the respective high-voltage input signals to the buffer parts 10x_1 to 10x_M. With respect to the input signals Si0Ly_1 to Si0Ly_F, the level shifters 90y_1 to 90y_F individually generate high-voltage input signals obtained by level-shifting respective amplitudes to a high-voltage amplitude (VGL to VGH), and supply the respective high-voltage input signals to the buffer parts 10y_1 to 10y_F.

Since the drive setting part 20A, the level shifters 97y_1 and 97y_2, and the bias part 30A (30B and 30C) shown in FIG. 16 are the same as those described above, operation descriptions thereof will be omitted.

However, in the multi-output buffer device 200C, the bias voltages VBP and VBN generated by the bias part 30A (30B and 30C) are supplied to all the buffer parts 10x_1 to 10x_M and the buffer parts 10y_1 to 10y_F. Further, the level shifter 97y_1 supplies the generated driving capability control signal Pc1 to the buffer parts 10y_1 to 10y_F, and the level shifter 97y_2 supplies the generated driving capability control signal Pc2 to the buffer parts 10y_1 to 10y_F.

Example 14

Figure 17:
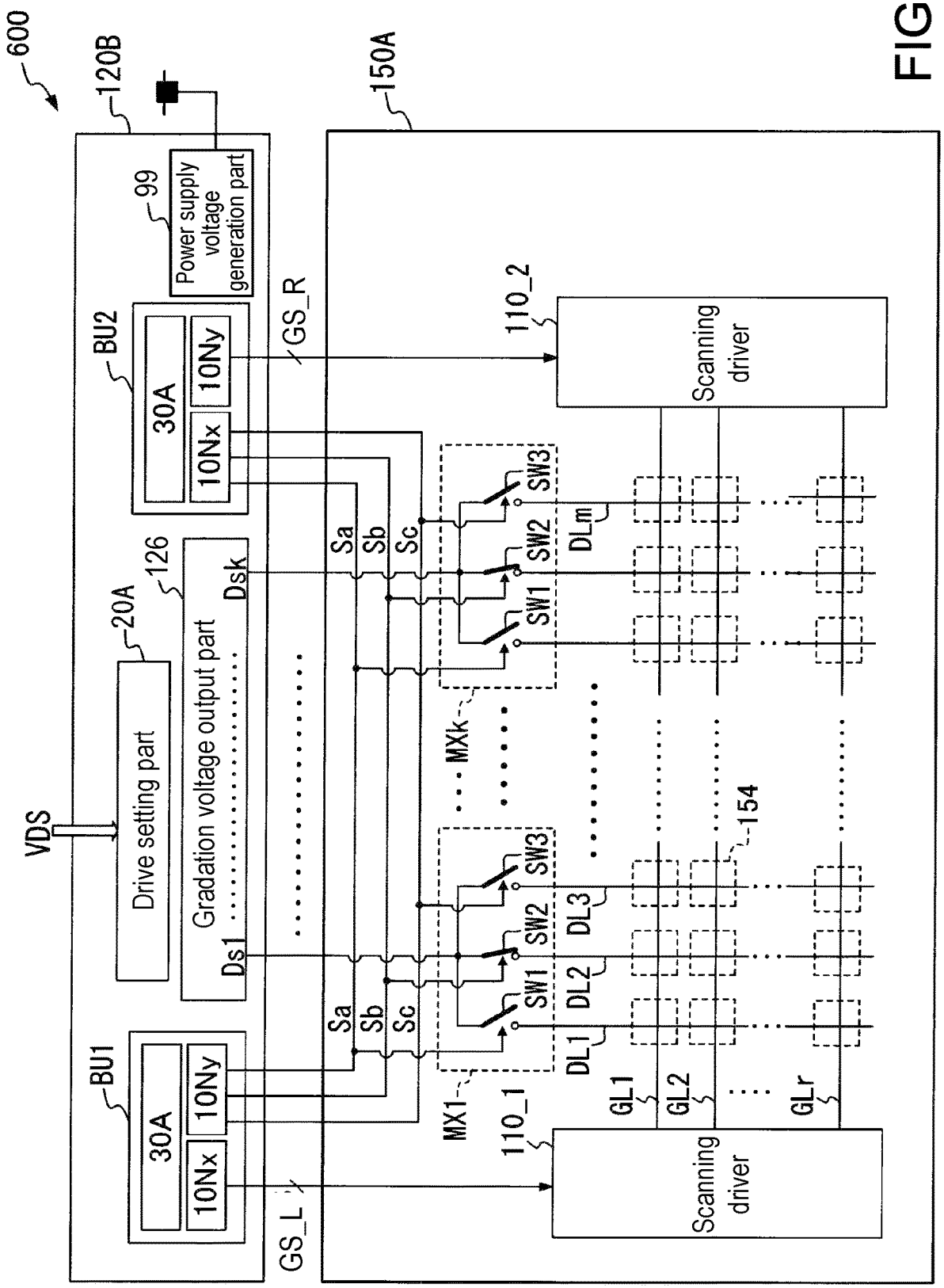
FIG. 17 is a block diagram showing a schematic constitution of a time-division driven type display device 600 adopting the multi-output buffer devices 200B and 200C shown in FIG. 14 and FIG. 16.

FIG. 17 is a block diagram showing a schematic constitution of a time-division driven type display device 600 including the multi-output buffer device 200B shown in FIG. 14.

The display device 600 includes a data driver 120B and a display panel 150A that has gate lines GL1 to GLr (r is an integer of 2 or larger) disposed in a horizontal direction of a screen and data lines DL1 to DLm (m is an integer of 2 or larger) disposed in a manner intersecting each gate line. The display device 600 adopts a time-division driving method in which the data lines DL1 to DLm are grouped into groups of three, for example, and within each group, the three data lines are driven one by one in a time-division manner in one horizontal scanning period. Further, at the display panel 150A, a display cell 154 for dealing with pixels is formed at intersection parts between each of the gate lines GL1 to GLr and each of the data lines DL1 to DLm.

Furthermore, scanning drivers 110_1 and 110_2 and multiplexers MX1 to MXk (k is an integer of 2 or larger) are arranged on the display panel 150A.

The scanning driver 110_1 is connected to one end of each of the gate lines GL1 to GLr, and the scanning driver 110_2 is connected to the other end of each of the gate lines GL1 to GLr. The scanning driver 110_1 generates a gate selection signal at a timing indicated by a gate line timing signal group GS_L supplied from the data driver 120B, and sequentially supplies the gate selection signal to the one end of each of the gate lines GL1 to GLr. The scanning driver 110_2 generates a gate selection signal at a timing indicated by a gate line timing signal group GS_R supplied from the data driver 120B, and sequentially supplies the gate selection signal to the other end of each of the gate lines GL1 to GLr.

Each of the multiplexers MX1 to MXk includes one input terminal that individually receives gradation voltage signals Ds1 to Dsk corresponding to each pixel from the data driver 120B, three output terminals that are connected to three data lines of a same group among the data lines DL1 to DLm, and switches SW1 to SW3 that individually connect or disconnect between the input terminal and each of the three output terminals. The switches SW1 to SW3 are sequentially and alternatively set to an ON state according to data line selection signals Sa, Sb, and Sc supplied from the data driver 120B.

The data driver 120B is composed of a semiconductor IC chip and includes a drive setting part 20A, a power supply voltage generation part 99, a gradation voltage output part 126, and control buffer parts BU1 and BU2. The data driver 120B is composed of, for example, one or a plurality of semiconductor chips and receives a video data signal VDS and various control signals from outside.

Figure 18:
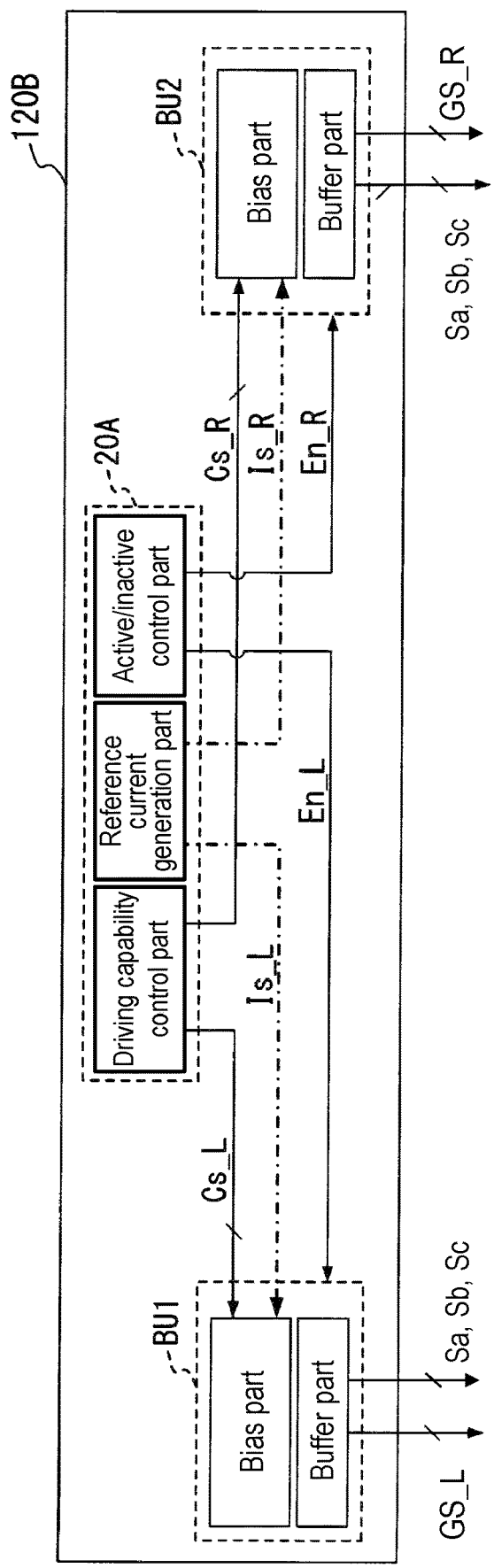
FIG. 18 is a diagram showing an example of arrangement positions of a drive setting part 20A and control buffer parts BU1 and BU2 in a data driver 120B of the display device 600.

FIG. 18 is a diagram illustrating an example of arrangement positions of the drive setting part 20A and the control buffer parts BU1 and BU2 in the data driver 120B of the display device 600.

As shown in FIG. 18, the data driver 120B has a rectangular planar region having a long side along an extending direction of the gate lines of the display panel 150A, in which the drive setting part 20A is arranged at a central part, and the control buffer parts BU1 and BU2 are arranged respectively at one end and the other end in a longitudinal direction sandwiching the drive setting part 20A.

The drive setting part 20A acquires a series of video data pieces indicating the luminance level of each pixel based on the video data signal VDS and supplies the series of video data pieces to the gradation voltage output part 126 (not shown in FIG. 18).

Further, the drive setting part 20A supplies, to the control buffer parts BU1 and BU2, a control signal group forming the basis for first to third data line switching signals that sequentially and alternatively set the switches SW1 to SW3 of each of the multiplexers MX1 to MXk to an ON state, and a gate line timing signal that indicates a timing for selecting the gate line.

Furthermore, the drive setting part 20A includes a driving capability control part, a reference current generation part, and an active/inactive control part.

The driving capability control part generates setting signals Cs_L and Cs_R each including the setting signal Cs described above and driving capability control signals Pctl1 and Pctl2, supplies the setting signal Cs_L to the control buffer part BU1, and supplies the setting signal Cs_R to the control buffer part BU2.

The reference current generation part generates reference currents Is_L and Is_R of two systems, supplies the reference current Is_L to the control buffer part BU1, and supplies the reference current Is_R to the control buffer part BU2.

The active/inactive control part generates active/inactive control signals En_L and En_R indicating whether to set the control buffer parts BU1 and BU2 individually to either an active or inactive state, supplies the active/inactive control signal En_L to the control buffer part BU1, and supplies the active/inactive control signal En_R to the control buffer part BU2. As shown in FIG. 17, in the case of driving the display panel 150A with one data driver 120B, the active/inactive control part outputs the active/inactive control signals En_L and En_R which activate both the control buffer parts BU1 and BU2. In contrast, in the case of driving the display panel 150A using a plurality of data drivers 120B, the active/inactive control part of the data driver closest to the scanning driver 110_1 of the display panel 150A outputs the active/inactive control signals En_L and En_R which activate and deactivate the control buffer parts BU1 and BU2, respectively. Further, the active/inactive control part of the data driver closest to the scanning driver 110_2 of the display panel 150A outputs the active/inactive control signals En_L and En_R which deactivate and activate the control buffer parts BU1 and BU2, respectively. Furthermore, in the case where there are three or more data drivers driving the display panel 150A, the active/inactive control part of data drivers other than the data drivers at two ends outputs the active/inactive control signals En_L and En_R which deactivate both the control buffer parts BU1 and BU2.

The power supply voltage generation part 99 receives an external power supply voltage, generates various power supply voltages for operating each module based on the external power supply voltage, and supplies the power supply voltages to the drive setting part 20A, the gradation voltage output part 126, and the control buffer parts BU1 and BU2.

The gradation voltage output part 126 generates gradation voltage signals Ds1 to Dsk having voltage values corresponding to the luminance level of each pixel indicated by the series of video data supplied from the drive setting part 20A, and supplies the respective gradation voltage signals Ds1 to Dsk to the input terminals of the multiplexers MX1 to MXk, respectively.

Each of the control buffer parts BU1 and BU2 includes a bias part 30A shown in FIG. 14, a multi-output buffer 10Nx composed of a plurality of buffer parts 10Ax each as shown in FIG. 14, and a multi-output buffer 10Ny composed of a plurality of buffer parts 10Ay each as shown in FIG. 14.

The bias part 30A of each of the control buffer parts BU1 and BU2 supplies common bias voltages VBP and VBN for setting the current driving capability to the multi-output buffers 10Nx and 10Ny.

The multi-output buffer 10Nx of each of the control buffer parts BU1 and BU2 is set to a current driving capability based on the bias voltages VBP and VBN. At this time, the multi-output buffer 10Nx of the control buffer part BU1 generates a gate line timing signal group GS_L indicating a timing for selecting the gate line, and supplies the gate line timing signal group GS_L to the scanning driver 110_1 serving as a load. Further, the multi-output buffer 10Nx of the control buffer part BU2 generates a gate line timing signal group GS_R indicating a timing for selecting the gate line, and supplies the gate line timing signal group GS_R to the scanning driver 110_2 serving as a load.

The multi-output buffer 10Ny of each of the control buffer parts BU1 and BU2 is set to a current driving capability based on the bias voltages VBP and VBN and the driving capability control signal (Pctl1 and Pctl2). The multi-output buffer 10Ny of the control buffer part BU1 generates data line selection signals Sa, Sb, and Sc that cause each of the multiplexers MX1 to MXk to sequentially and alternatively select the three data lines connected thereto.

As shown in FIG. 17, the multi-output buffer 10Ny of the control buffer part BU1 supplies the data line selection signals Sa, Sb, and Sc from a left end side of each of three wirings extending and arranged in a horizontal scanning direction of the display panel 150A to the multiplexers MX1 to MXk serving as loads. As shown in FIG. 17, the multi-output buffer 10Ny of the control buffer part BU2 supplies the data line selection signals Sa, Sb, and Sc from a right end side of each of three wirings extending and arranged in the horizontal scanning direction of the display panel 150A to the multiplexers MX1 to MXk serving as loads.

Thus, in the time-division driven type display device as shown in FIG. 17, by applying the multi-output buffer device 200B shown in FIG. 14, it is possible to perform driving of loads (scanning driver and multiplexer) of two systems that require different current driving capabilities.

What is claimed is:

1. An output buffer circuit outputting, from an output terminal, an output signal obtained by amplifying an input signal, the output buffer circuit comprising:
    a first transistor of a first conductivity type that supplies a first high-voltage power supply voltage to the output terminal in a case of being in an ON state in response to a voltage of the input signal received through a gate of itself;
    a second transistor of a second conductivity type that supplies a second high-voltage power supply voltage lower than the first high-voltage power supply voltage to the output terminal in the case of being in the ON state in response to a voltage of the input signal received through a gate of itself;
    a bias part that generates a bias voltage;
    an output control part that shifts a transistor, of the first transistor and the second transistor, in the ON state to an OFF state at a time of voltage change of the input signal by changing the voltage in the gate of the transistor in the ON state at a rate of change corresponding to the voltage change of the input signal, and turns a transistor, of the first transistor and the second transistor, in the OFF state to the ON state by changing the voltage in the gate of the transistor in the OFF state at a rate of change based on a current value controlled by the bias voltage; and
    a drive setting part that designates a voltage value of the bias voltage and generates a setting signal for setting the bias voltage to the voltage value,
    wherein the bias part includes a bias modulation part which operates upon reception of a first low-voltage power supply voltage having a voltage value equal to or smaller than the first high-voltage power supply voltage and a second low-voltage power supply voltage having a voltage value equal to or larger than the second high-voltage power supply voltage, and sets the voltage value of the bias voltage to a voltage value based on the setting signal.

2. The output buffer circuit according to claim 1,
    wherein the bias part includes a withstand voltage protection part which eliminates influence of the first high-voltage power supply voltage and the second high-voltage power supply voltage and controls a voltage applied for an output of the bias modulation part such that the voltage stays in a low-voltage power supply voltage range from the second low-voltage power supply voltage to the first low-voltage power supply voltage.

3. The output buffer circuit according to claim 2, wherein the bias modulation part generates a voltage having a voltage value within the low-voltage power supply voltage range based on the setting signal and outputs the voltage as the bias voltage.

4. The output buffer circuit according to claim 2, wherein the bias modulation part generates a voltage having a voltage value within the low-voltage power supply voltage range based on the setting signal, and wherein the bias part includes an amplifier which outputs, as the bias voltage, an amplified voltage obtained by amplifying the voltage generated by the bias modulation part to a voltage within a high-voltage power supply voltage range from the second high-voltage power supply voltage to the first high-voltage power supply voltage.

5. The output buffer circuit according to claim 1, wherein the bias modulation part includes a current source which generates a current having a current value corresponding to the setting signal, and wherein the bias part includes a current voltage conversion part which converts the current into a voltage and outputs a converted voltage as the bias voltage.

6. The output buffer circuit according to claim 5, wherein the bias modulation part includes a reference voltage generation part which generates a plurality of reference voltages, and a DA conversion part which selects a reference voltage based on the setting signal from the plurality of reference voltages and outputs the selected reference voltage as the bias voltage.

7. The output buffer circuit according to claim 1, wherein the first low-voltage power supply voltage is lower than the first high-voltage power supply voltage and the second low-voltage power supply voltage is equal to or higher than the second high-voltage power supply voltage, or the first low-voltage power supply voltage is equal to or lower than the first high-voltage power supply voltage and the second low-voltage power supply voltage is higher than the second high-voltage power supply voltage.

8. The output buffer circuit according to claim 1, wherein the bias part generates a pair of a first bias voltage and a second bias voltage as the bias voltage, and wherein the output control part has
a first node which supplies a first voltage to the gate of the first transistor,
a second node which supplies a second voltage to the gate of the second transistor,
a third transistor of the first conductivity type which receives the input signal through a gate, supplies a first power supply voltage to the first node in the case of being in the ON state in response to the input signal, and shifts the first transistor to the OFF state,
a fourth transistor of the second conductivity type which receives the input signal through a gate, supplies a second power supply voltage to the second node in the case of being in the ON state in response to the input signal, and shifts the second transistor to the OFF state,
a fifth transistor of the second conductivity type which receives the first bias voltage through a gate, changes the first voltage of the first node to a second power supply voltage side at a rate of change based on a current value controlled by the first bias voltage in a case of being activated in response to the voltage change of the input signal, and shifts the first transistor to the ON state, and
a sixth transistor of the first conductivity type which receives the second bias voltage through a gate, changes the second voltage of the second node to a first power supply voltage side at a rate of change based on a current value controlled by the second bias voltage in a case of being activated in response to the voltage change of the input signal, and shifts the second transistor to the ON state.

9. The output buffer circuit according to claim 1, wherein the bias part generates a pair of a first bias voltage and a second bias voltage as the bias voltage, and wherein the output control part includes
a first inverter which receives the first high-voltage power supply voltage through a positive-side power supply terminal of itself and supplies a voltage of a signal obtained by inverting a phase of the input signal to the gate of the first transistor,
a third transistor of the second conductivity type which has a drain connected to a negative-side power supply terminal of the first inverter, receives the second high-voltage power supply voltage through a source, and receives the first bias voltage through a gate,
a second inverter which receives the second high-voltage power supply voltage through a negative-side power supply terminal of itself and supplies a voltage of a signal obtained by inverting a phase of the input signal to the gate of the second transistor, and
a fourth transistor of the first conductivity type which has a drain connected to a positive-side power supply terminal of the second inverter, receives the first high-voltage power supply voltage through a source, and receives the second bias voltage through a gate.

10. The output buffer circuit according to claim 1, wherein the bias part generates a pair of a first bias voltage and a second bias voltage as the bias voltage, and wherein the output control part includes
a third transistor of the first conductivity type which receives the input signal through a gate and supplies the first high-voltage power supply voltage in the case of being in the ON state in response to the input signal to a first node connected to the gate of the first transistor,
a fourth transistor of the second conductivity type which receives the input signal through a gate and supplies the second high-voltage power supply voltage in the case of being in the ON state in response to the input signal to a second node connected to the gate of the second transistor,
a fifth transistor of the second conductivity type which receives the first bias voltage through a gate, has a source connected to the second node, and has a drain connected to the first node, and
a sixth transistor of the first conductivity type which receives the second bias voltage through a gate, has a source connected to the first node, and has a drain connected to the second node.

11. The output buffer circuit according to claim 1, wherein the bias part generates a pair of a first bias voltage and a second bias voltage as the bias voltage, wherein the input signal is a first input signal and a second input signal which has an earlier rise timing of a voltage and a later fall timing thereof than the first input signal, and wherein the output control part includes
a first inverter which receives the first high-voltage power supply voltage through a positive-side power supply terminal of itself and supplies a voltage of a signal obtained by inverting a phase of the first input signal to the gate of the first transistor,
a third transistor of the second conductivity type which has a drain connected to a negative-side power supply terminal of the first inverter, receives the second high-voltage power supply voltage through a source, and receives the first bias voltage through a gate,
a second inverter which receives the second high-voltage power supply voltage through a negative-side power supply terminal of itself and supplies a voltage of a signal obtained by inverting a phase of the second input signal to the gate of the second transistor, and
a fourth transistor of the first conductivity type which has a drain connected to a positive-side power supply terminal of the second inverter, receives the first high-voltage power supply voltage through a source, and receives the second bias voltage through a gate.

12. An output buffer circuit outputting first to Mth output signals obtained by amplifying first to Mth input signals, M being an integer of 2 or larger, the output buffer circuit comprising:
a bias part that generates a bias voltage;
a drive setting part that designates a voltage value of the bias voltage and generates a setting signal for setting the bias voltage to the voltage value; and
first to Mth buffer parts that individually receive the first to Mth input signals and output the first to Mth output signals via respective output terminals,
wherein each of the first to Mth buffer parts includes
a first transistor of a first conductivity type which supplies a first high-voltage power supply voltage to the output terminal of itself in a case of being in an ON state in response to a voltage of the input signal received through a gate of itself;
a second transistor of a second conductivity type which supplies a second high-voltage power supply voltage lower than the first high-voltage power supply voltage to the output terminal of itself in the case of being in the ON state in response to a voltage of the input signal received through a gate of itself; and
an output control part which shifts a transistor, of the first transistor and the second transistor, in the ON state to an OFF state at a time of voltage change of the input signal by changing the voltage in the gate of the transistor in the ON state at a rate of change corresponding to the voltage change of the input signal, and turns a transistor, of the first transistor and the second transistor, in the OFF state to the ON state by changing the voltage in the gate of the transistor in the OFF state at a rate of change based on a current value controlled by the bias voltage, and
wherein the bias part is provided in a manner of being shared by each of the first to Mth buffer parts,
the bias part includes a bias modulation part which operates upon reception of a first low-voltage power supply voltage having a voltage value smaller than the first high-voltage power supply voltage or equal to or smaller than the first high-voltage power supply voltage and a second low-voltage power supply voltage having a voltage value larger than the second high-voltage power supply voltage or equal to or larger than the second high-voltage power supply voltage, and sets the voltage value of the bias voltage to a voltage value based on the setting signal, and the bias part supplies the bias voltage having a voltage value set by the bias modulation part to each of the first to Mth buffer parts.

13. The output buffer circuit according to claim 12,
wherein the output control part of at least one buffer part among the first to Mth buffer parts comprises a charge-discharge speed control part comprising a plurality of transistors that are connected in parallel with each other and receive the bias voltage at respective gates to generate the current value according to a composite current of a current corresponding to the bias voltage, and
the charge-discharge speed control part receives a driving capability control signal and changes the current value of the composite current by individually activating or deactivating each of the plurality of transistors in accordance with the driving capability control signal.

14. The output buffer circuit according to claim 13,
wherein the output control part comprises:
a first node that supplies a voltage corresponding to the input signal as a first voltage to the gate of the first transistor; and
a second node that supplies a voltage corresponding to the input signal as a second voltage to the gate of the second transistor,
wherein the charge-discharge speed control part draws the composite current corresponding to the bias voltage from the first node during the ON state of the first transistor, and supplies the composite current corresponding to the bias voltage to the second node during the ON state of the second transistor.

15. A data driver driving a display panel according to a video signal, the display panel comprising: a plurality of scanning lines disposed in a horizontal direction of a screen, a plurality of data lines, to which a plurality of drive signals based on the video signal are supplied from the data driver, disposed in a manner intersecting the plurality of scanning lines and a scanning driver that drives the plurality of scanning lines at a timing corresponding to a plurality of scanning timing signals, and the data driver comprising:
a scanning control signal output circuit which outputs the plurality of scanning timing signals supplied to the scanning driver, and
wherein the scanning control signal output circuit is constituted of the output buffer circuit according to claim 12.

16. A display driver driving, in response to a video signal, a passive matrix-type display panel including a plurality of scanning lines disposed in a horizontal direction of a screen and a plurality of data lines disposed in a manner intersecting the plurality of scanning lines, the display driver comprising:
a data driver that includes a first output buffer part which outputs a plurality of drive pulse signals having a pulse width corresponding to a luminance level of each pixel indicated by the video signal to the plurality of data lines; and
a scanning driver that includes a second output buffer part which outputs a plurality of scanning pulse signals to the plurality of scanning lines,
wherein the first output buffer part and the second output buffer part are respectively constituted of the output buffer circuit according to claim 12.

17. A display device comprising a display panel and a data driver,
wherein the display panel comprises: a plurality of scanning lines disposed in a horizontal direction of a screen;

a plurality of data lines, to which a plurality of drive signals based on a video signal are supplied from the data driver, disposed in a manner intersecting the plurality of scanning lines; and a scanning driver which drives the plurality of scanning lines at a timing corresponding to a plurality of scanning timing signals, and wherein the data driver comprises: a scanning control signal output circuit outputting the plurality of scanning timing signals to the scanning driver, and wherein the scanning control signal output circuit is constituted of the output buffer circuit according to claim 12.

\* \* \* \* \*